United States Patent
Sasagawa et al.

(10) Patent No.: US 6,675,155 B2
(45) Date of Patent: *Jan. 6, 2004

(54) LAYOUT METHOD ARRANGING NODES CORRESPONDING TO LSI ELEMENTS HAVING A CONNECTING RELATIONSHIP

(75) Inventors: Fumiyoshi Sasagawa, Kawasaki (JP); Akio Shinagawa, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/081,604

(22) Filed: May 20, 1998

(65) Prior Publication Data

US 2002/0010692 A1 Jan. 24, 2002

(30) Foreign Application Priority Data

Oct. 24, 1997 (JP) ........................................... 09-292985

(51) Int. Cl.[7] .............................................. G06F 15/18
(52) U.S. Cl. .................................. 706/13; 716/8; 716/9
(58) Field of Search ................................ 706/13; 716/8, 716/9

(56) References Cited

U.S. PATENT DOCUMENTS

| | | | | |
|---|---|---|---|---|
| 5,465,218 A | * | 11/1995 | Handa | 716/8 |
| 5,557,533 A | * | 9/1996 | Koford et al. | 716/9 |
| 5,742,738 A | * | 4/1998 | Koza et al. | 706/13 |
| 5,898,597 A | * | 4/1999 | Scepanovic et al. | 716/9 |

FOREIGN PATENT DOCUMENTS

| JP | 9-91265 | 4/1997 | ........... G06F/15/18 |
|---|---|---|---|

OTHER PUBLICATIONS

John R. Koza, Genetic Programming: On the Programming of Computers by Means of Natural Selection, 18, 21, 74–76, 94–99, 110–12, 160–61, 479–84, 599–600, 607–08, 1993.*

K. Glasmacher et al., "Chip Assembly in the PLAYOUT VLSI Design System," 1992 European Design Automation Conference (EURO–DAC '92), EURO–VHDL '92, pp. 215–221, Sep. 1992.*

K. Glasmacher et al., "A Genetic Algorithm for Global Improvement of Macrocell Layouts," Proceedings of the 1991 IEEE International Conference on Computer Design (ICCD '91), pp. 306–313, Oct. 1991.*

B. Schurmann et al., "Three–Phase Chip Planning—An Improved Top–Down Chip Planning Strategy," 1992 IEEE/ACM International Conference on Computer–Aided Design (ICCAD–92), Digest of Technical Papers, pp. 598–605, Nov. 1992.*

(List continued on next page.)

*Primary Examiner*—George B. Davis

(57) ABSTRACT

The invention provides an arrangement optimization problem processing apparatus for arranging a plurality of nodes in an optimum condition in a two- or more-dimensional space, by which an optimum arrangement of a plurality of nodes can be determined at a high speed even where a node arrangement optimization problem having a large problem scale is to be processed. The arrangement optimization problem processing apparatus includes a hyper node formation section for grouping the plurality of nodes to form a plurality of hyper nodes each formed from a set of nodes, a hyper node arrangement section for executing an optimization problem solution algorithm to determine solutions to a problem of arrangement of the plurality of hyper nodes formed by the hyper node formation section in the generation space and arranging the plurality of hyper nodes in the generation space based on one of the determined solutions.

40 Claims, 21 Drawing Sheets

OTHER PUBLICATIONS

R.-M. King et al., "Optimization by Simulated Evolution with Applications to Standard Cell Placement," 27th ACM/IEEE Design Autmation Conference, 1990, pp. 20–25 Jun. 1990.*

C. J. Alpert et al., "Multilevel Circuit Partitioning," Proceedings of the 34th Annual ACM/IEEE Design Automation Conference, pp. 530–533, Jun. 1997.*

K. Shahookar et al., "VLSI Cell Placement Techniques" (selected portions), ACM Computing Surveys, vol. 23, No. 2, pp. 143, 195–220, Jun. 1991.*

A. L. Corcoran III et al., "A Genetic Algorithm for Packing in Three Dimensions," Proceedings of the 1992 ACM/SIGAPP Symposium on Applied Computing (vol. II): Technological Challenges of the 1990's, p. 1021, Mar. 1992.*

H.-J. Eikerling et al., "Automatic Structuring and Optimization of Hierarchical Designs," Proceedings of the 1996 European Design Autmation Conference (EURO–DAC), with EURO–VHDL '96 and Exhibition), pp. 134–139 Sep. 1996.*

B. Carse et al., "Parallel Evolutionary Learning of Fuzzy Rule Bases using the Island Injection Genetic Algorithm," 1997 IEEE International Conference on Systems, Man, and Cybernetics, vol. 4, pp. 3692–3697, Oct. 1997.*

* cited by examiner

FIG. 7

|  | 10 | 11 |  |
|---|---|---|---|
| 100 | 101 | 110 | 111 |
|  | 5 | 0 | 0 |
|  |  | 0 | 4 |
|  |  |  | 7 |

(left labels: 10 / 100, 10 / 101, 11 / 110, 11 / 111)

FIG. 8

| HYPER NODE 10 | | | | HYPER NODE 11 | | | | HYPER NODE 12 | | | |
|---|---|---|---|---|---|---|---|---|---|---|---|
| x | y | X | Y | x | y | X | Y | x | y | X | Y |
| 0.24 | 0.74 | 0.52 | 0.53 | 0.78 | 0.73 | 0.48 | 0.53 | 0.52 | 0.23 | 1.00 | 0.47 |

F I G. 15

REPRODUCTION

CHROMOSOME                          FITNESS

☐                                    f 0

☐                                    f 1

⋮                                    ⋮

☐                                    f n

FIG. 16
CROSSOVER
PARENTS
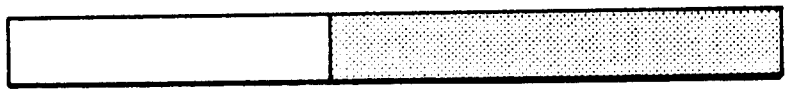
CHILDREN
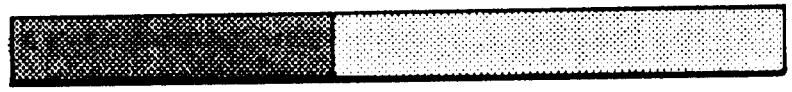

MUTATION

F I G. 20
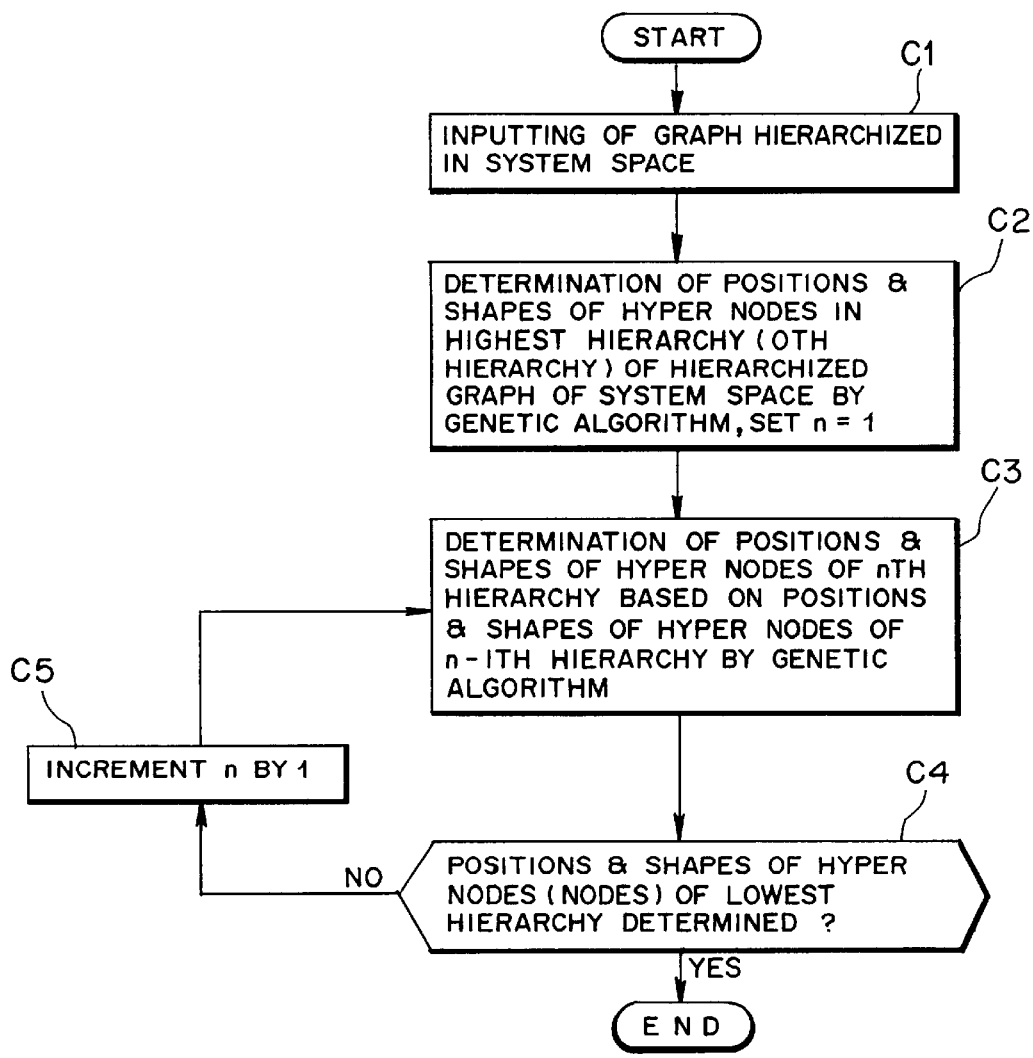

LAYOUT METHOD ARRANGING NODES CORRESPONDING TO LSI ELEMENTS HAVING A CONNECTING RELATIONSHIP

BACKGROUND OF THE INVENTION

1. Field of the Invention

This invention relates to an arrangement optimization problem processing method and an arrangement optimization problem processing apparatus as well as a computer-readable recording medium on which an arrangement optimization problem processing program is recorded, suitable for use, for example, to process a circuit arrangement optimization problem for arranging circuits in an optimum condition on a large scale integrated circuit (LSI), more generally a node arrangement optimization problem (or element arrangement optimization problem) for arranging a plurality of nodes (or elements) in an optimum condition in a two- or more-dimensional space.

2. Description of the Related Art

A node arrangement optimum problem particularly is a problem for arranging (mapping) a plurality of nodes, whose connection relationships are indicated in a system space, in an optimum condition in a generation space, and is called graph mapping problem.

First, connection relationships of a plurality of nodes in a system space are shown in FIG. 22. Referring to FIG. 22, reference symbols 130a to 130h denote fixed nodes whose arrangement in a generation space is determined already, and reference numerals 100 to 102, 110, 111 and 120 to 122 denote non-fixed nodes whose optimum arrangement in the generation space is to be determined. Further, reference numeral 1000 denotes the system space.

In the system space 1000, connection relationships between the plurality of nodes are given as a graph 1001. In the graph 1001, the nodes 130a to 130h, 100 to 102, 110, 111 and 120 to 122 are regarded as vertices, and the connection relationships (indicated by double-sided arrow marks in FIG. 22) between the nodes are regarded as sides between the vertices. It is to be noted that the coupling strength between each two nodes is indicated by the thickness of the pertaining double-sided arrow mark.

When it is tried to arrange the plurality of non-fixed nodes 100 to 102, 110, 111 and 120 to 122 in the generation space, the following constraints are taken into consideration:

i) Magnitudes of the Nodes in the Generation Space

Each of the nodes has a peculiar magnitude.

ii) Connection Relationships of a Plurality of Nodes in the System Space

Connection relationships between a plurality of nodes are given as a graph 1001. Further, a certain node is connected to a fixed node.

Then, by executing, for example, a genetic algorithm as an algorithm for solution to an optimization problem while the constraints described above are taken into consideration, optimum arrangement of the plurality of nodes 100 to 102, 110, 111 and 120 to 122 in the generation space is determined, and based on the determination, the plurality of nodes 100 to 102, 110, 111 and 120 to 122 are arranged in the generation space.

It is to be noted that a genetic algorithm is an algorithm devised based on a concept of the principle of evolution of organisms. In the genetic algorithm, candidates for a solution to an arrangement optimization problem are represented as chromosomes which are arrangements of genes, and various genetic operations (selection/self-reproduction, mutation and crossover) are performed for the chromosomes to update the generation to determine an optimum solution given as a gene arrangement of a chromosome having a high fitness value (that is, an optimum arrangement of the plurality of nodes 100 to 102, 110, 111 and 120 to 122 in the generation space).

An example of a result of arrangement of the plurality of nodes 100 to 102, 110, 111 and 120 to 122 in the generation space is shown in FIG. 23.

Generally, the generation space is a two- or more-dimensional space, and each node may have an arbitrary shape in accordance with the dimensions of the generation space. Referring to FIG. 23, the generation space 2000 shown has a rectangular shape, and the nodes (non-fixed nodes 100 to 102, 110, 111 and 120 to 122 shown in FIG. 22) have shapes defined to rectangles and arranged in the generation space 2000. It is to be noted that, also in FIG. 23, reference symbols 130a to 130h denote fixed nodes whose arrangement in the generation space is determined already.

By executing a genetic algorithm to process a node arrangement optimization problem in this manner, an optimum arrangement of a plurality of nodes in an actual space in which only connection relationships are indicated is obtained.

In regard to, for example, an LSI mentioned above, if an optimum arrangement of circuits on the LSI can be determined, then not only minimization of the LSI can be achieved, but also minimization in length of wiring lines for interconnecting the circuits can be achieved to augment the wiring facility. Consequently, higher speed processing in the LSI can be achieved.

However, there is a subject to be solved in that, where a genetic algorithm is employed as an optimization problem solution algorithm which is used to process a node arrangement optimization problem, when the scale of the optimization problem is large, that is, when the number of nodes whose optimum arrangement is to be determined is very large, very much time is required to determine an optimum arrangement of the nodes.

SUMMARY OF THE INVENTION

It is an object of the present invention to provide an arrangement optimization problem processing method and apparatus by which an optimum arrangement of a plurality of nodes can be determined at a high speed even where a node arrangement optimization problem having a large problem scale is to be processed and a computer-readable recording medium on which an arrangement optimization problem processing program for causing a computer to operate to process a node arrangement optimization problem is recorded.

In order to attain the object described above, according to an aspect of the present invention, there is provided an arrangement optimization problem processing method for arranging a plurality of nodes, whose connection relationships are indicated in a system space, in a generation space, comprising a hyper node formation step of grouping the plurality of nodes to form a plurality of hyper nodes each formed from a set of nodes, a hyper node arrangement step of executing an optimization problem solution algorithm to determine solutions to a problem of arrangement of the plurality of hyper nodes formed by the hyper node formation step in the generation space and arranging the plurality of hyper nodes in the generation space based on one of the determined solutions, and a node optimum arrangement step of executing the optimization problem solution algorithm taking arrangement relationships of the plurality of hyper nodes obtained by the hyper node arrangement step into consideration to determine a solution to a problem of arrangement of the plurality of nodes in an optimum condition in the generation space and arranging the plurality of nodes in the generation space based on the determined solution.

The hyper node arrangement step may arrange the plurality of hyper nodes in the generation space taking a constraint in arrangement of the hyper nodes into consideration.

Further, the arrangement optimization problem processing method may be constructed such that each of the hyper nodes includes a plurality of sub hyper nodes each formed from a partial set of a plurality of nodes which form the hyper node, and the arrangement optimization problem processing method further comprise a constraint search step of determining the constraint to the hyper node based on the constraint to the sub hyper nodes.

The hyper node arrangement step may execute a genetic algorithm as the optimization problem solution algorithm to determine solutions to the problem of arrangement of the plurality of hyper nodes formed by the hyper node formation step in the generation space and arrange the plurality of hyper nodes in the generation space based on one of the determined solutions.

The hyper node arrangement step may arrange the plurality of hyper nodes in the generation space based on an optimum one of the determined solutions or may arrange the plurality of hyper nodes in the generation space based on one of the determined solutions other than the optimum solution.

Where the generation space is a two-dimensional space, the hyper node arrangement step and the node optimum arrangement step may define shapes of the hyper nodes and the nodes as two-dimensional shapes and arrange the hyper nodes and the nodes in the generation space, respectively.

Where the generation space has a rectangular shape, when the hyper node arrangement step and the node optical arrangement step define shapes of the hyper nodes and the nodes to rectangles and arrange the hyper nodes and the nodes in the generation space, respectively, the hyper node arrangement step and the node optimum arrangement step may represent the hyper nodes and the nodes as genes composed of information regarding center coordinates of the rectangles and information regarding aspect ratios of the rectangles and execute the genetic algorithm using chromosomes composed of arrangements of the genes as solution candidates to the problem of arrangement of the plurality of hyper nodes and the plurality of nodes in the generation space, respectively.

When the genetic algorithm is executed, pasting crossover wherein information regarding the center coordinates of the rectangle of one of the genes which compose one of the chromosomes and information regarding the aspect ratio of the rectangle are replaced with the center coordinate information and the aspect ratio information, respectively, of a corresponding one of the genes which compose another one of the chromosomes can be performed as a genetic operation for the chromosomes.

When the genetic algorithm is executed, pasting crossover wherein information regarding the center coordinates of the rectangle of one of the genes which compose one of the chromosomes is replaced with the center coordinate information of a corresponding one of the genes which compose another one of the chromosomes may be performed as a genetic operation for the chromosomes.

In this instance, the pasting crossover may be based on a weighted average of the information regarding the center coordinates of the rectangles.

Further, when the genetic algorithm is executed, pasting crossover wherein information regarding the aspect ratio of the rectangle of one of the genes which compose one of the chromosomes is replaced with the aspect ratio information of a corresponding one of the genes which compose another one of the chromosomes may be performed as a genetic operation for the chromosomes.

In this instance, the pasting crossover may be based on a weighted average of the information regarding the aspect ratios of the rectangles.

When the genetic algorithm is executed, mutation wherein the information regarding the aspect ratio of the rectangle of the gene which composes the chromosome is varied may be performed as a genetic operation for the chromosome.

In this instance, the mutation may increase or decrease the information regarding the aspect ratio of the rectangle at a fixed ratio.

Further, it may be stochastically determined whether the information regarding the aspect ratio of the rectangle should be increased or decreased in the fixed ratio by the mutation.

When the genetic algorithm is executed, mutation wherein the information regarding the center coordinates of the rectangle of the gene which composes the chromosome is varied may be performed as a genetic operation for the chromosome.

In this instance, the mutation may add a stochastically selected value to the information regarding the center coordinates of the rectangle to vary the information regarding the center coordinates of the rectangle.

When the genetic algorithm is executed, before selection as a genetic operation is performed for the chromosome, a fitness value of the chromosome may be calculated taking a sum total of lengths of wiring lines for interconnecting the plurality of hyper nodes arranged in the generation space into consideration.

As an alternative, when the genetic algorithm is executed, before selection as a genetic operation is performed for the chromosome, a fitness value of the chromosome may be calculated taking a sum total of areas of overlapping portions of the plurality of hyper nodes arranged in the generation space into consideration.

As another alternative, when the genetic algorithm is executed, before selection as a genetic operation is performed for the chromosome, a fitness value of the chromosome may be calculated taking a sum total of lengths of wiring lines for interconnecting the plurality of hyper nodes arranged in the generation space and a sum total of areas of overlapping portions of the plurality of hyper nodes into consideration.

The calculation of the fitness value may be performed by performing weighted calculation for either one of a sum total of lengths of wiring lines for interconnecting the plurality of hyper nodes and a sum total of areas of overlapping portions of the plurality of hyper nodes.

When the genetic algorithm is executed, before selection as a genetic operation is performed for the chromosome, a fitness value of the chromosome may be calculated taking a sum total of areas of gap portions among the plurality of hyper nodes arranged in the generation space into consideration.

As an alternative, when the genetic algorithm is executed, before selection as a genetic operation is performed for the chromosome, a fitness value of the chromosome may be calculated taking a sum total of lengths of wiring lines for interconnecting the plurality of hyper nodes arranged in the generation space and a sum total of areas of gap portions among the plurality of hyper nodes into consideration.

The calculation of the fitness value may be performed by performing weighted calculation for either one of a sum total of lengths of wiring lines for interconnecting the plurality of hyper nodes and a sum total of areas of gap portions among the plurality of hyper nodes.

Accordingly, with the arrangement optimization problem processing method described above, since hyper nodes formed by grouping a plurality of nodes are arranged in a space and the plurality of nodes are arranged in the space taking arrangement relationships of the hyper nodes, an advantage is exhibited in that, also when it is tried to process a node arrangement optimization problem having a large problem scale, an optimum arrangement of the plurality of nodes can be determined at a high speed.

According to another aspect of the present invention, there is provided an arrangement optimization problem processing method for arranging a plurality of elements in a two- or more-dimensional space, comprising a hyper element formation step of grouping the plurality of elements to form a plurality of hyper elements each formed from a set of elements, a hyper element arrangement step of executing an optimization problem solution algorithm to determine solutions to a problem of arrangement of the plurality of hyper elements formed by the hyper element formation step in the generation space and arranging the plurality of hyper elements in the generation space based on one of the determined solutions, and an element optimum arrangement step of executing another optimization problem solution algorithm taking arrangement relationships of the plurality of hyper elements obtained by the hyper element arrangement step into consideration to determine a solution to a problem of arrangement of the plurality of elements in an optimum condition in the generation space and arranging the plurality of elements in the generation space based on the determined solution.

Also with the arrangement optimization problem processing method, an advantage is exhibited in that, also when it is tried to process an element arrangement optimization problem having a large problem scale, an optimum arrangement of a plurality of elements can be determined at a high speed.

According to a further aspect of the present invention, there is provided an arrangement optimization problem processing apparatus for processing a node arrangement optimization problem to arrange a plurality of nodes, whose connection relationships are indicated in a system space, in an optimum condition in a generation space, comprising a hyper node formation section for grouping the plurality of nodes to form a plurality of hyper nodes each formed from a set of nodes, a hyper node arrangement section for executing an optimization problem solution algorithm to determine solutions to a problem of arrangement of the plurality of hyper nodes formed by the hyper node formation section in the generation space and arranging the plurality of hyper nodes in the generation space based on one of the determined solutions, and a node optimum arrangement section for executing the optimization problem solution algorithm taking arrangement relationships of the plurality of hyper nodes obtained by the hyper node arrangement section into consideration to determine a solution to a problem of arrangement of the plurality of nodes in an optimum condition in the generation space and arranging the plurality of nodes in the generation space based on the determined solution.

According to a still further aspect of the present invention, there is provided a computer-readable recording medium storing an arrangement optimization problem processing program for causing a computer to process a node arrangement optimization problem to arrange a plurality of nodes, whose connection relationships are indicated in a system space, in an optimum condition in a generation space, the arrangement optimization problem processing program causing the computer to function as a hyper node formation section for grouping the plurality of nodes to form a plurality of hyper nodes each formed from a set of nodes, a hyper node arrangement section for executing an optimization problem solution algorithm to determine solutions to a problem of arrangement of the plurality of hyper nodes formed by the hyper node formation section in the generation space and arranging the plurality of hyper nodes in the generation space based on one of the determined solutions, and a node optimum arrangement section for executing the optimization problem solution algorithm taking arrangement relationships of the plurality of hyper nodes obtained by the hyper node arrangement section into consideration to determine a solution to a problem of arrangement of the plurality of nodes in an optimum condition in the generation space and arranging the plurality of nodes in the generation space based on the determined solution.

Also with the arrangement optimization problem processing apparatus and the computer-readable recording medium, an advantage is exhibited in that, also when it is tried to process a node arrangement optimization problem having a large problem scale, an optimum arrangement of a plurality of nodes can be determined at a high speed.

Further objects, features and advantages of the present invention will become apparent from the following detailed description when read in conjunction with the accompanying drawings in which like parts or elements are denoted by like reference characters.

BRIEF DESCRIPTION OF THE DRAWINGS

FIG. 7 is a diagram illustrating an example of a coupling strength table;

FIG. 8 is a diagrammatic view showing an example of a construction of chromosomes;

FIGS. 15 to 17 are diagrammatic views individually illustrating the gene operations illustrated in FIG. 14:

FIGS. 18 to 21 are flow charts illustrating different operations of the arrangement optimization problem processing apparatus of FIG. 1.

DESCRIPTION OF THE PREFERRED EMBODIMENT a. Construction of an Arrangement Optimization Problem Processing Apparatus According to an Embodiment of the Present Invention FIG. 1 shoes in block diagram a construction of an arrangement optimization problem processing apparatus according to a preferred embodiment of the present invention. The arrangement optimization problem processing apparatus 1 shown in FIG. 1 processes a node arrangement optimization problem (graph mapping problem) mentioned hereinabove.

Figure 1:
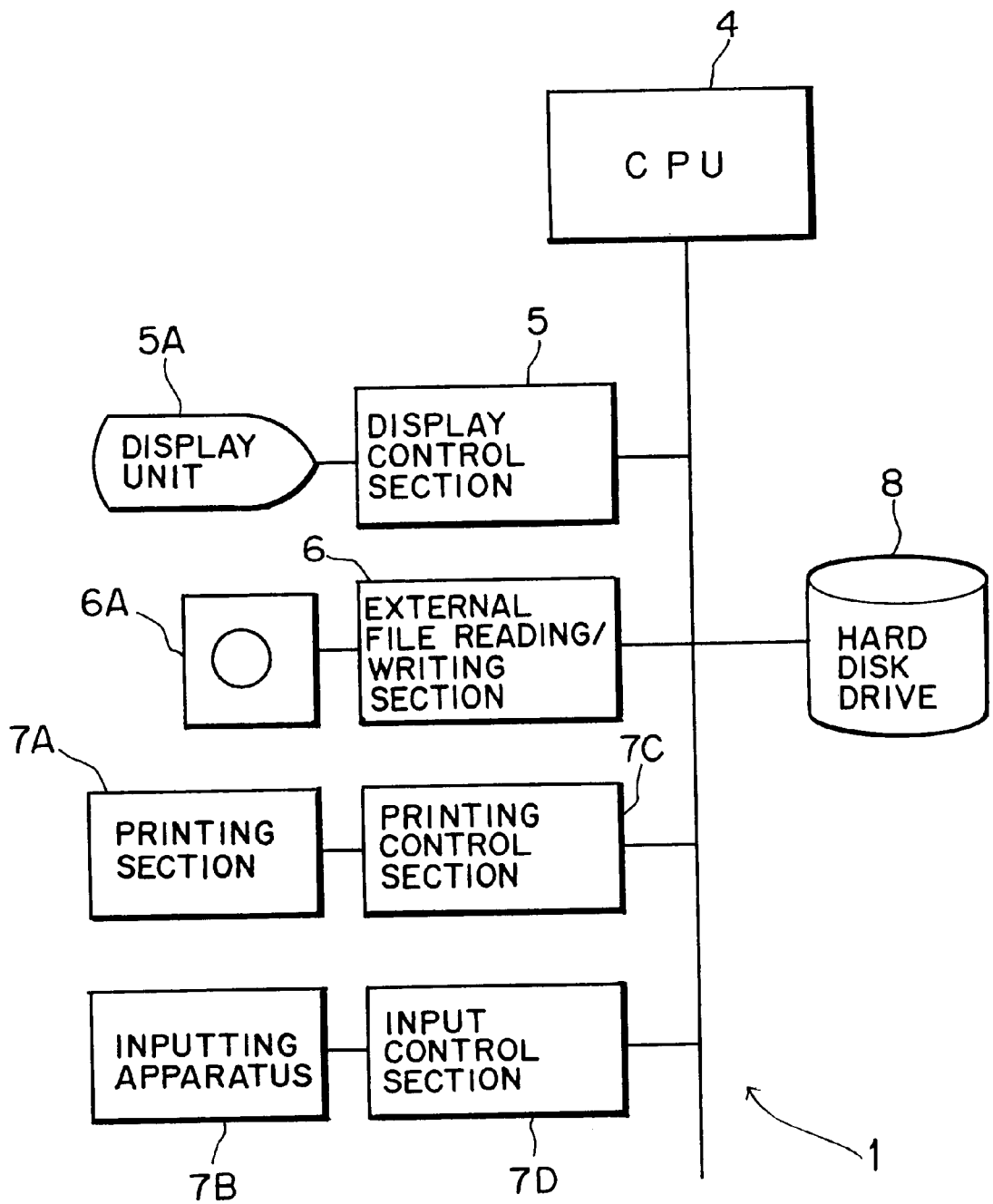
FIG. 1 is a block diagram showing a construction of an arrangement optimization problem processing apparatus according to an embodiment of the present invention.

Referring to FIG. 1, the arrangement optimization problem processing apparatus 1 shown includes a display unit 5A for displaying various setting screens, an optimum arrangement of a plurality of nodes obtained by processing and so forth thereon, a display control section 5 for controlling the displaying condition of the display unit 5A, an inputting apparatus 7B such as a keyboard or a mouse manually operable by an operator, who refers to display data on the display unit 5A, for inputting response information to the display data therethrough, and an input control section 7D for controlling the inputting apparatus 7B.

The arrangement optimization problem processing apparatus 1 further includes a hard disk drive 8 for storing all information necessary for the arrangement optimization problem processing apparatus 1 to operate including an operation system and storing an arrangement optimization problem processing program which will be hereinafter described.

The arrangement optimization problem processing apparatus 1 further includes an external file reading/writing section 6, an external file 6A, a printing section 7A, and a printing control section 7C. The external file reading/writing section 6 or the printing section 7A records an optimum arrangement of a plurality of nodes displayed on the display unit 5A and so forth into the external file 6A or on suitable paper in response to an instruction from the inputting apparatus 7B.

The arrangement optimization problem processing apparatus 1 further includes a CPU 4 for managing all of the components of the arrangement optimization problem processing apparatus 1.

Figure 2:
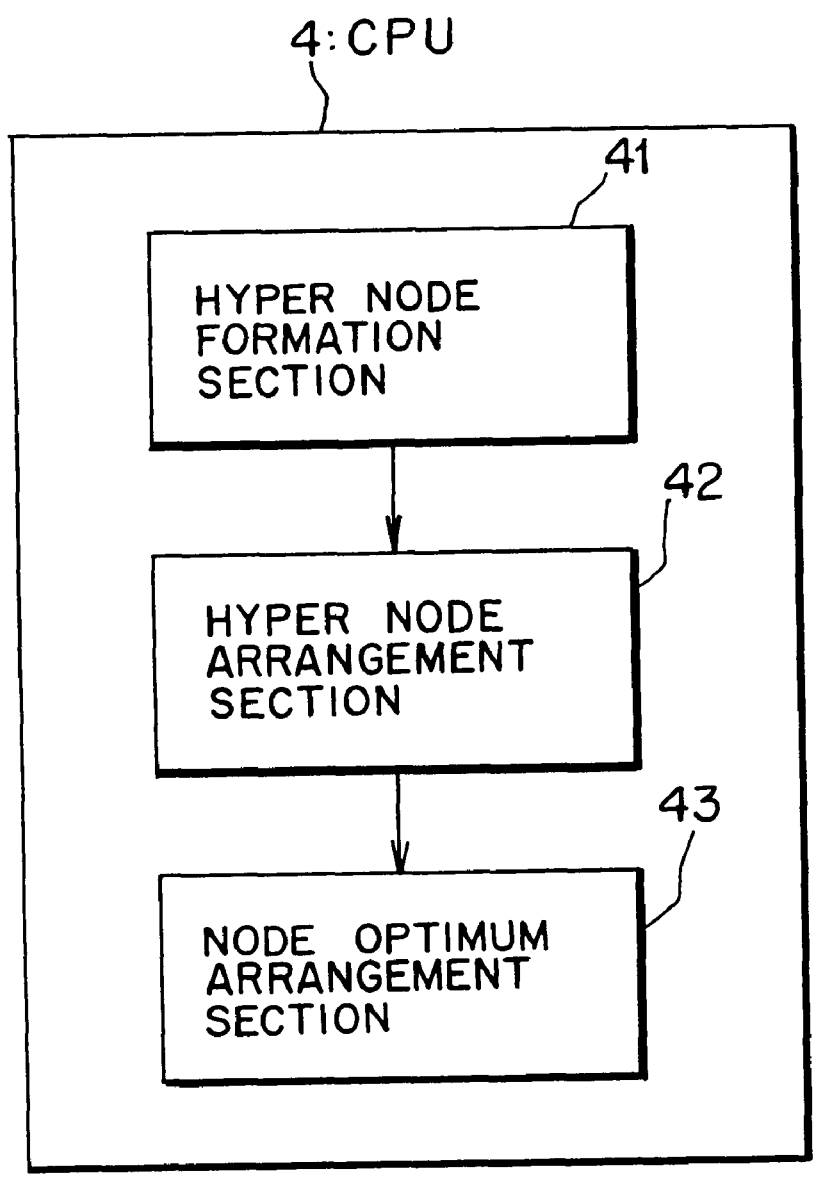
FIG. 2 is a functional block diagram showing a construction of a CPU of the arrangement optimization problem processing apparatus of FIG. 1.

In the arrangement optimization problem processing apparatus 1 of the present embodiment, the CPU 4 has functions corresponding to those of such a hyper node formation section 41, a hyper node arrangement section 42 and a node optimum arrangement section 43 as shown in FIG. 2.

Referring to FIG. 2, the hyper node formation section 41 groups a plurality of nodes, whose connection relationships are indicated in a system space, to form a plurality of hyper nodes each formed from a set of nodes. Further, in the present embodiment, the hyper node formation section 41 also has a function as a constraint searching section for determining constraints to be used for arrangement of hyper nodes.

The hyper rode arrangement section 42 executes an optimization problem solution algorithm (for example, a genetic algorithm) to determine solutions to the problem of arrangement of a plurality of hyper nodes formed by the hyper node formation section 41 in a generation space and arranges the plurality of hyper nodes in the generation space based on the thus determined solution.

The node optimum arrangement section 43 further executes the optimization problem solution algorithm (for example, a genetic algorithm) taking arrangement relationships of a plurality of hyper nodes obtained by the hyper node arrangement section 42 into consideration to determine a solution (that is, an optimum solution) to the problem of arrangement of a plurality of nodes in an optimum condition, and arranges the plurality of nodes in the generation space based on the thus determined solution.

It is to be noted that the functions corresponding to the hyper node formation section 41, hyper node arrangement section 42 and node optimum arrangement section 43 described above are actually realized as operation of the CPU 4 by reading out a program (hereinafter referred to as arrangement optimization problem processing program) recorded on a recording medium such as the hard disk drive 8 described above or a CD-ROM (not shown) into a memory (RAM) not shown and starting and executing the program by the CPU 4.

The arrangement optimization problem processing program causes the computer to function as the hyper node formation section 41 which groups a plurality of nodes to form a plurality of hyper nodes each formed from a set of nodes, the hyper node arrangement section 42 which executes the optimization problem solution algorithm to determine solutions to the problem of arrangement of the plurality of hyper nodes formed by the hyper node formation section 41 in a generation space and arranges the plurality of hyper nodes in the generation space based on the thus determined solutions, and the node optimum arrangement section 43 which further executes the optimization problem solution algorithm taking arrangement relationships of the plurality of hyper nodes obtained by the hyper node arrangement section 42 into consideration to determine a solution to the problem of arrangement of the plurality of nodes in an optimum condition in the generation space and arranges the plurality of nodes in the generation space based on the thus determined solution.

It is to be noted that the arrangement optimization problem processing program is stored, for example, on a CD-ROM or a like medium and installed from the CD-ROM or the like medium into the hard disk drive 8 of and used by the computer.

In other words, the hard disk drive 8, the CD-ROM or the like medium mentioned above corresponds to a computer-readable recording medium on which the arrangement optimization problem processing program is recorded.

In this manner, the arrangement optimization problem processing apparatus 1 according to the present embodiment can be implemented using an ordinary computer system (computer) which includes such CPU 4, display unit 5A, display control section 5, external file reading/writing section 6, printing section 7A, printing control section 7C, inputting apparatus 7B, input control section 7D, hard disk drive 8 and so forth as described above.

b. Operation of the Arrangement Optimization Problem Processing Apparatus According to the Embodiment of the Invention A processing method for a node arrangement optimization problem mentioned hereinabove as operation of the arrangement optimization problem processing apparatus 1 according to the embodiment of the present invention is described with reference to the flow charts of FIGS. 18 to 21 and so forth.

In the arrangement optimization problem processing apparatus 1 according to the present embodiment, an arrangement optimization problem of a plurality of nodes is processed by executing the steps (hyper node formation step, constraint search step, hyper node arrangement step and node optimum arrangement step) described below.

First, the hyper node formation section 41 groups a plurality of nodes, whose connection relationships are indicated in a system space, to form a plurality of hyper nodes each formed from a set of nodes [hyper node formation step (step A1 of FIG. 18)].

Figure 4:
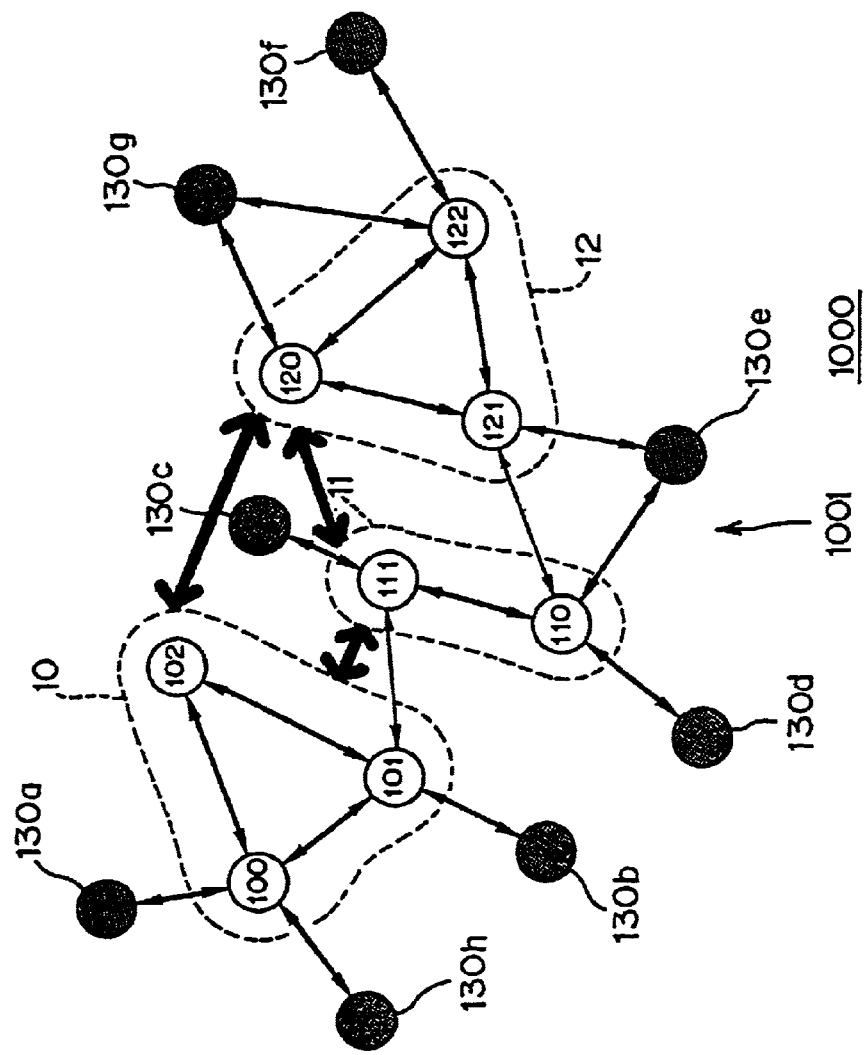
FIG. 4 is a diagrammatic view showing connection relationships of a plurality of nodes in a system space.
Figure 22:
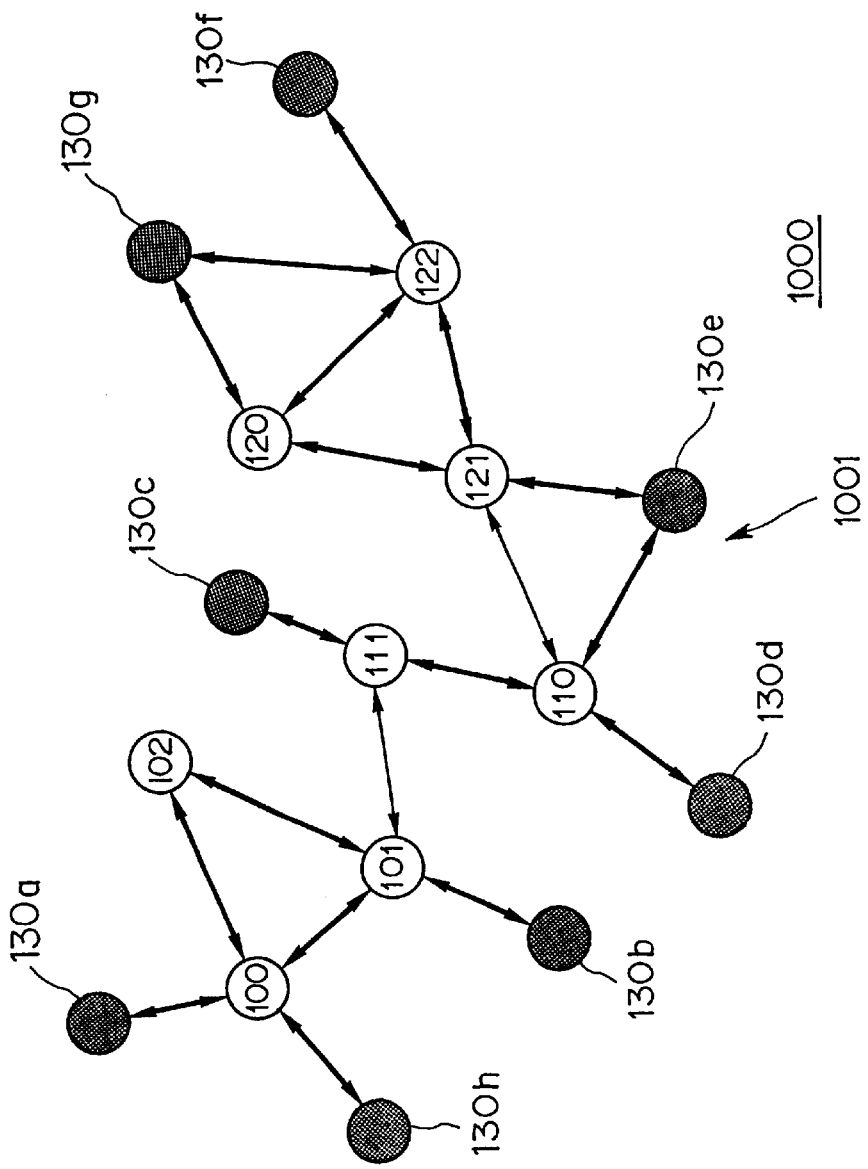
FIGS. 22 and 23 are diagrammatic views illustrating a popular arrangement optimization problem processing method.
Figure 23:
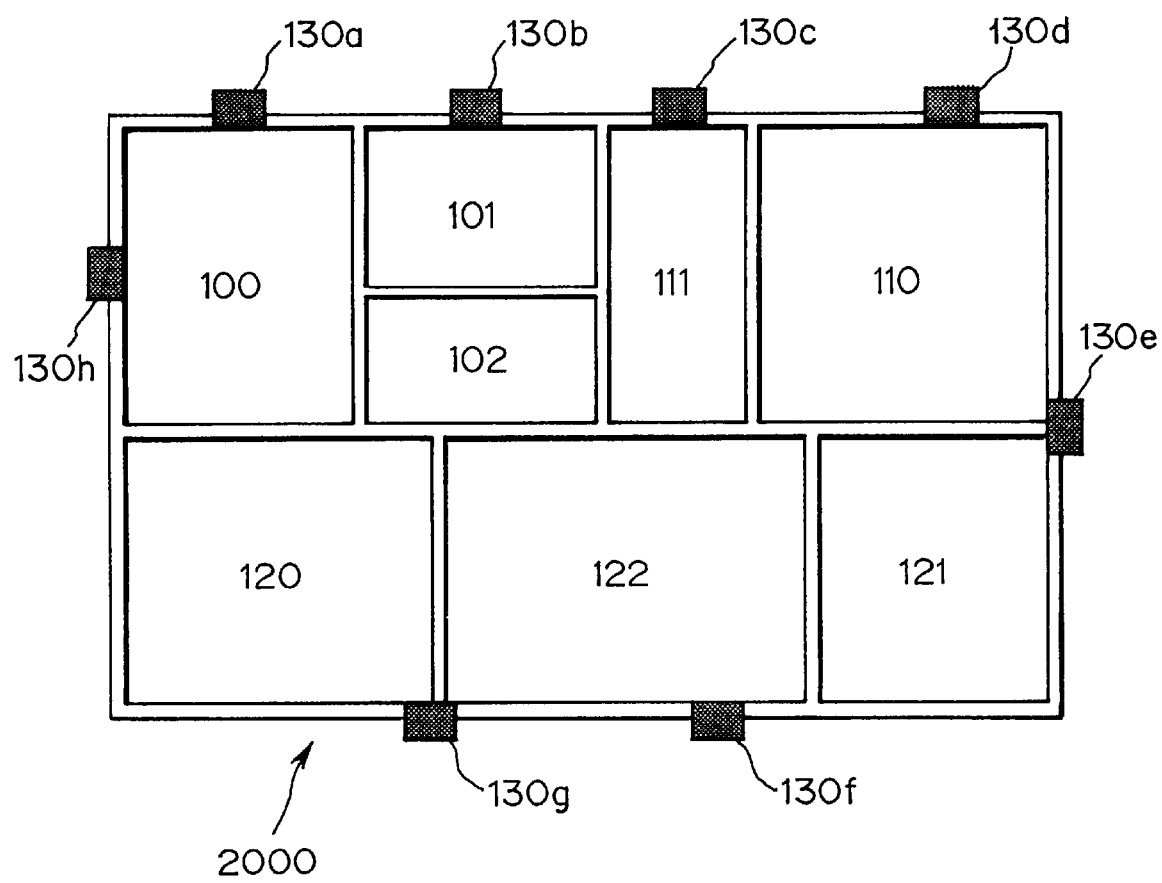

Connection relationships (coupling relationships) of a plurality of nodes in a system space are shown in FIG. 4. Also in FIG. 4, similarly as in FIG. 22, reference symbols 130a to 130h denote fixed nodes whose arrangement in a generation space is determined already, and reference numerals 100 to 120, 110, 111 and 120 to 122 denote non-fixed nodes whose optimum arrangement in the generation space is to be determined. Further, reference numeral 1000 denotes the system space (the system space may have arbitrary dimensions).

In the system space 1000, connection relationships of a plurality of nodes are given as a graph 1001, in which the nodes 130a to 130h, 100 to 102, 110, 112 and 120 to 122 are regarded as vertices and the connection relationships (indicated by double-sided arrow marks in FIG. 4) of the nodes are regarded as sides between the vertices. It is to be noted that, also in FIG. 4, the coupling strength between each two nodes is represented by the thickness of a double-sided arrow mark between the nodes.

In the present embodiment, the plurality of non-fixed nodes 100 to 102, 110, 111 and 120 to 122 in the system space 1000 are grouped to form hyper nodes 10 to 12 by the hyper node formation section 41. For example, as shown in FIG. 4, the nodes 100 to 102 are grouped into the hyper node 10; the nodes 110 and 111 are grouped into the hyper node 11; and the nodes 120 to 122 are grouped into the hyper node 12.

Figure 5:
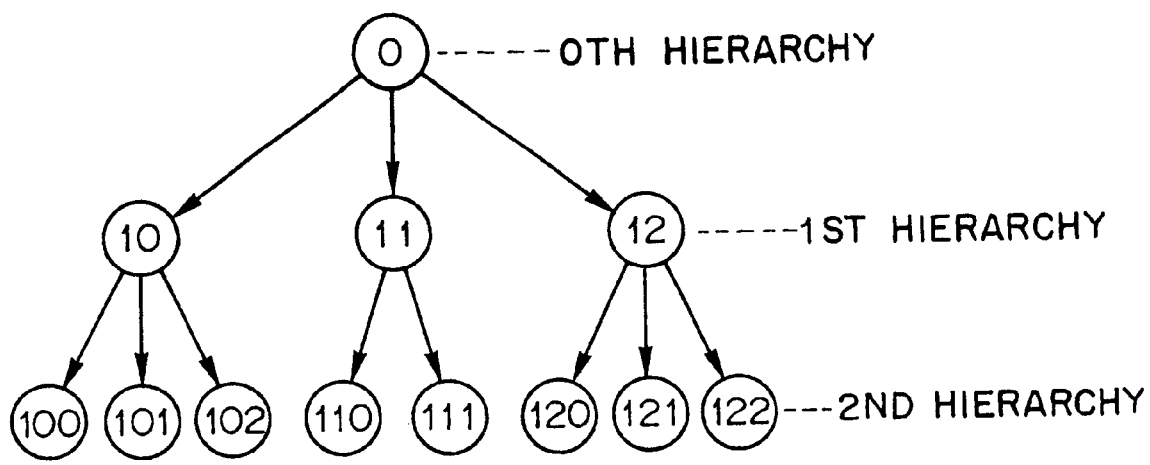
FIG. 5 is a diagrammatic view illustrating hierarchy of hyper nodes/nodes.

In other words, in the present embodiment, the graph 1001 which represents the problem is hierarchized as seen in FIG. 5 (more generally in FIG. 3) by the hyper node formation section 41.

Figure 3:
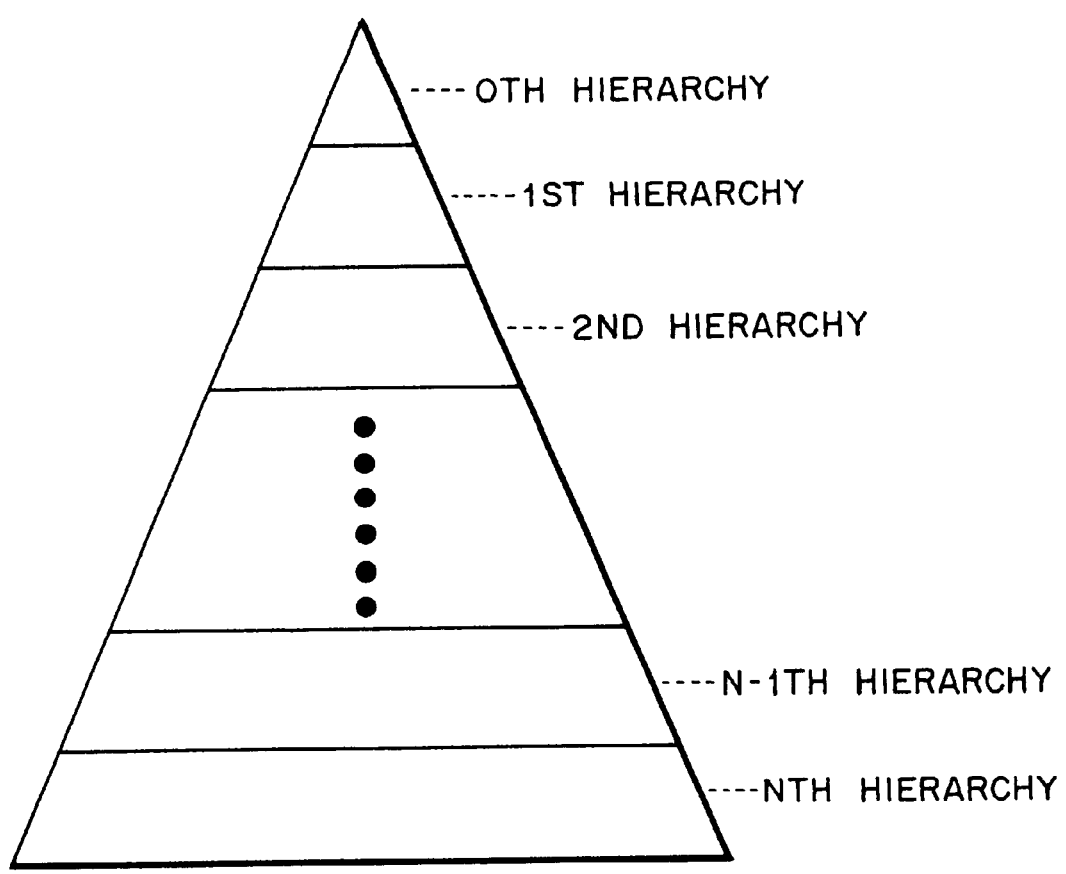
FIG. 3 is a diagrammatic view illustrating hierarchy of hyper nodes/nodes.

The hierarchies are formed in the following manner. Referring to FIG. 5, a hyper node of the 0th hierarchy (the hyper node includes all of the plurality of nodes 100 to 102, 110, 111 and 120 to 122) is divided into the hyper nodes 10 to 12 of the first hierarchy by the hyper node formation section 41. More generally, as seen in FIG. 3, a hyper node of the ith hierarchy (i=0 to N−1) is divided into a plurality of hyper nodes of the i+1th hierarchy by the hyper node formation section 41.

Accordingly, the graph is simpler in a higher hierarchy but is more complicated in a lower hierarchy. Then, the graph in the lowermost hierarchy (in FIG. 5, the second hierarchy, and in FIG. 3, the Nth hierarchy) coincides with the original graph 1001.

In other words, the hierarchical structure can be obtained by grouping, in the graph of the system space 1000, non-fixed nodes which are coupled in a high coupling strength to each other into a hyper node and grouping such hyper nodes into a higher order hyper node.

Then, the hyper node formation section 41 determines constraints to be applied when the hyper nodes 10 to 12 are to be arranged (such as the areas of the hyper nodes 10 to 12 and the connection relationships and coupling strengths of the hyper nodes 10 to 12) based on the areas of the nodes 100 to 102, 110, 111 and 120 to 122 and the connection relationships and coupling strengths of the nodes 100 to 102, 110, 111 and 120 to 122 [constraint search step (step A2 of FIG. 18)]. It is to be noted that the areas of the nodes 100 to 102, 110, 111 and 120 to 122 and the connection relationships and coupling strengths of the nodes 100 to 102, 110, 111 and 120 to 122 are assumed to be given in advance.

The area of each hyper node in each hierarchy is calculated as a sum total of areas of hyper nodes (or nodes) of a next lower order hierarchy to that of the hierarchy.

Meanwhile, the connection relationship and the coupling strength between any two hyper nodes in each hierarchy are determined based on connection relationships and coupling strengths between hyper nodes in a next lower hierarchy. Although originally the connection relationship and the coupling strength between two hyper nodes are determined based on connection relationships and coupling strengths between nodes which form the hyper nodes, this determination requires much time. Accordingly, in the present embodiment, from connection relationships and coupling strengths between hyper nodes in a lower hierarchy, connection relationships and coupling strengths between hyper nodes in a higher hierarchy are estimated thereby to determine connection relationships and coupling strengths between hyper nodes for each hierarchy.

More particularly, the connection relationship between a certain hyper node and another hyper node is determined taking whether or not there is a connection relationship (a double-sided arrow mark shown in FIG. 4) or relationships between hyper nodes (or nodes) in a lower hierarchy which form the certain hyper node and hyper nodes (or nodes) in the lower hierarchy which form the another hyper node, the number of such connection relationships and so forth into consideration.

Figure 19:
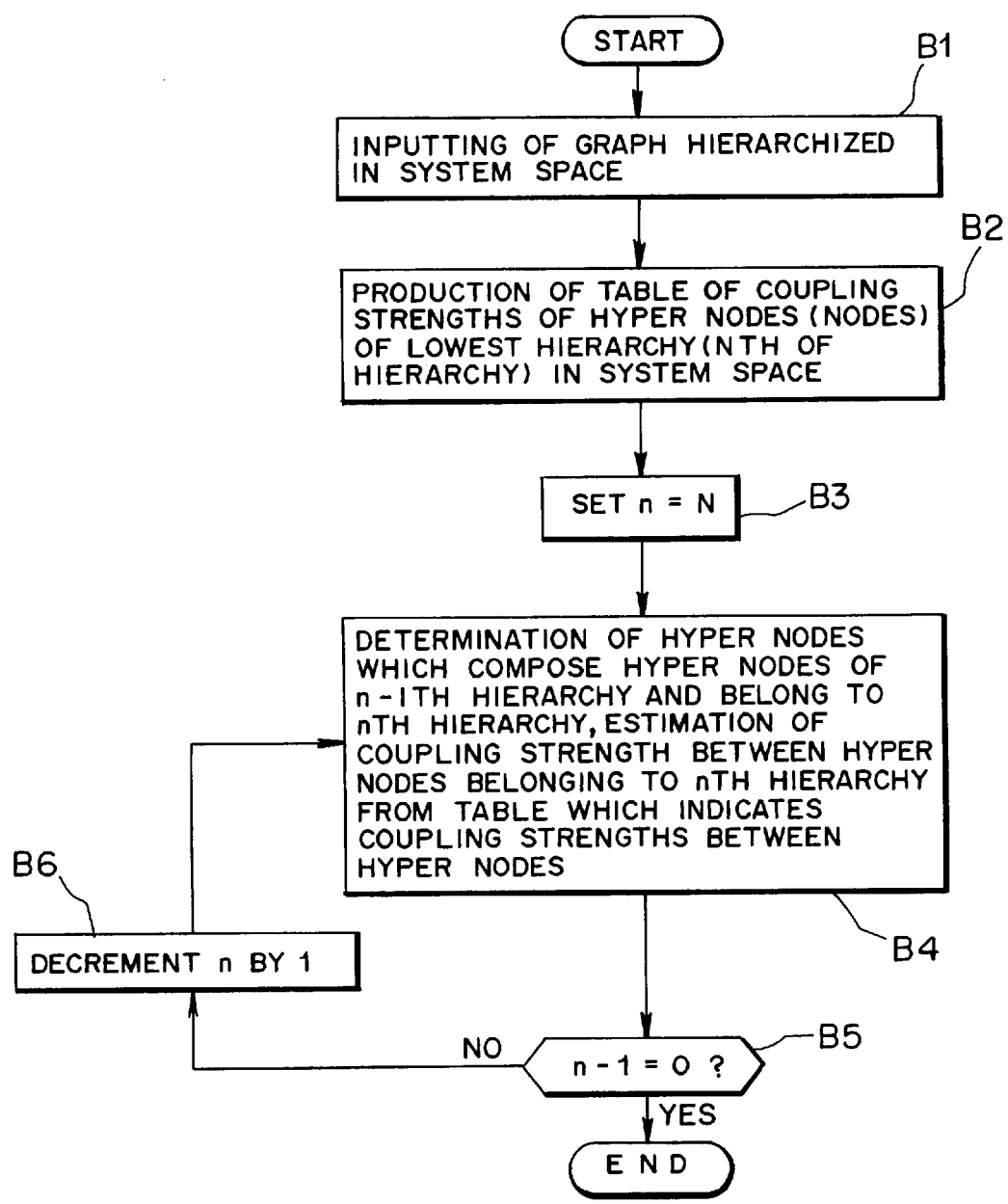

Meanwhile, the coupling strength between a certain hyper node and another hyper node is determined based on coupling strengths between hyper nodes (or nodes) in a lower hierarchy which form the certain hyper node and hyper nodes (or nodes) in the lower hierarchy which form the another hyper node (for details, refer to steps B1 to B6 of FIG. 19).

An example of a coupling strength table between the nodes 100, 101, 110 and 111 where the nodes of the lowermost hierarchy are the four nodes 100, 101, 110 and 111 and the hyper node 10 includes the nodes 100 and 101 while the hyper node 11 includes the nodes 110 and 111 is shown in FIG. 7. From FIG. 7, the coupling strength between the hyper nodes 10 and 11 is estimated to be a sum total 4 of the coupling strength 0 between the nodes 100 and 110, the coupling strength 0 between the nodes 100 and 111, the coupling strength 0 between the nodes 101 and 110 and the coupling strength 4 between the nodes 101 and 111.

In short, more generally, a hyper node includes a plurality of sub hyper nodes (hyper nodes in a lower hierarchy) each formed from a partial set of a plurality of nodes which form the hyper node, and constraints to the hyper node are determined based on constraints to the sub hyper nodes by the hyper node formation section 41.

Then, for example, a genetic algorithm as an optimization problem solution algorithm is executed by the hyper node arrangement section 42 to determine solutions to the problem of arrangement of the plurality of hyper nodes 10 to 12 (refer to FIGS. 4 and 5) formed by the hyper node formation section 41 in the generation space, and the plurality of hyper nodes 10 to 12 are arranged in the generation space based an optimum one of the thus determined solutions (hyper node arrangement step). In this instance, the plurality of hyper nodes 10 to 12 are arranged in the generation space taking the constraints in arrangement of the hyper nodes determined in such a manner as described above into consideration.

The optimization problem solution algorithm (for example, a genetic algorithm) is further executed by the node optimum arrangement section 43 taking the arrangement relationships of the hyper nodes 10 to 12 obtained by the hyper node arrangement section 42 into consideration to determine a solution to the problem of arrangement of the plurality of nodes 100 to 102, 110, 111 and 120 to 122 in an optimum condition in the generation space, and the plurality of nodes 100 to 102, 110, 111 and 120 to 122 are arranged in the generation space based on the thus determined solution (that is, an optimum solution) (node optimum arrangement step). It is to be noted that, in this instance, the plurality of nodes 100 to 102, 110, 111 and 120 to 122 are arranged in the generation space taking the constraints to arrangement of the nodes given in advance into consideration.

In short, generally a plurality of hyper nodes are arranged in a generation space for each hierarchy (each of the first to N−1th hierarchies), and a plurality of nodes in the lowermost hierarchy (Nth hierarchy) are arranged in the generation space finally. In particular, a genetic algorithm is executed to begin to determine solutions beginning with the highest hierarchy (first hierarchy) and successively determine solutions to the lower hierarchies (second to Nth hierarchies) to determine an optimum solution to the arrangement optimization problem (optimum arrangement of the plurality of nodes in the generation space).

Figure 18:
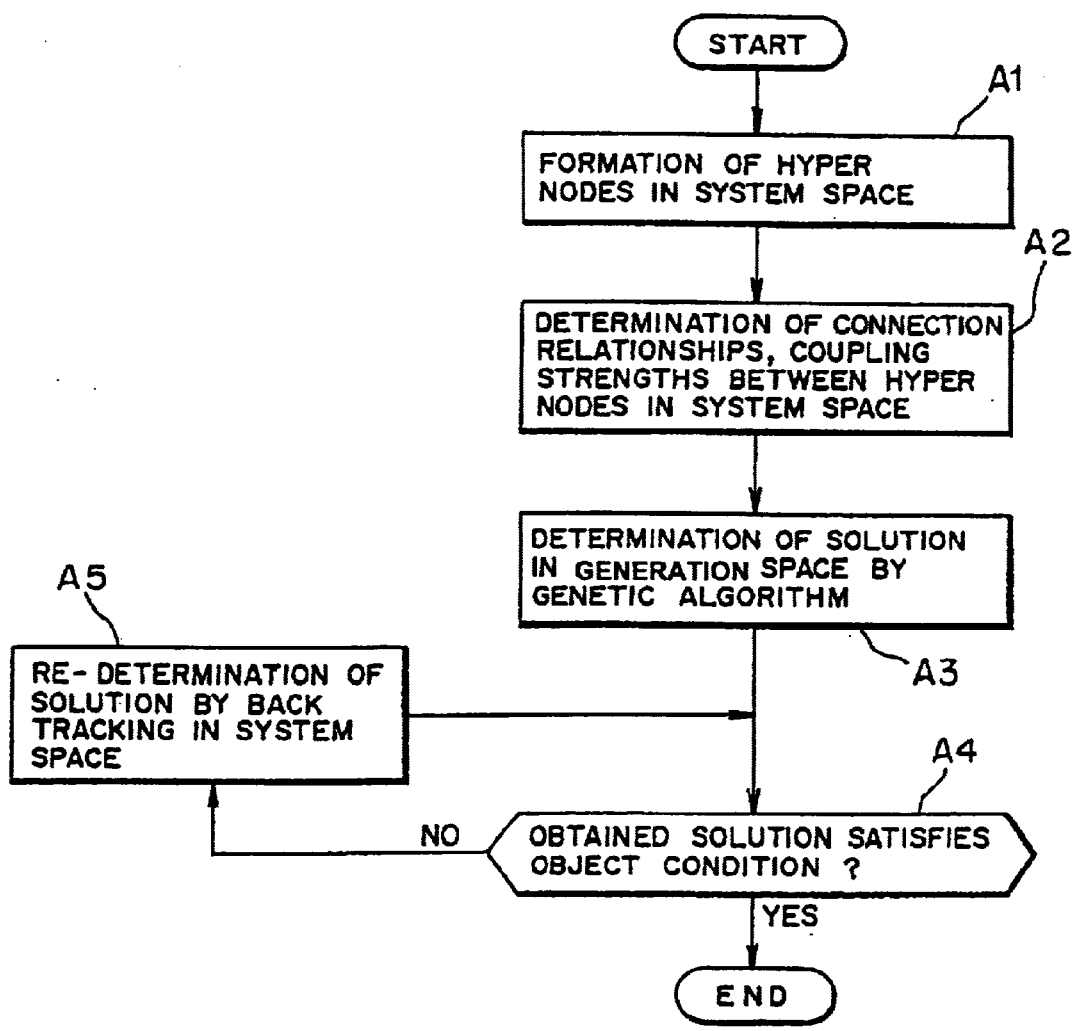

The hyper node arrangement step and the node optimum arrangement step correspond to step A3 of FIG. 18 and more particularly to steps C1 to C5 of FIG. 20.

Figure 21:
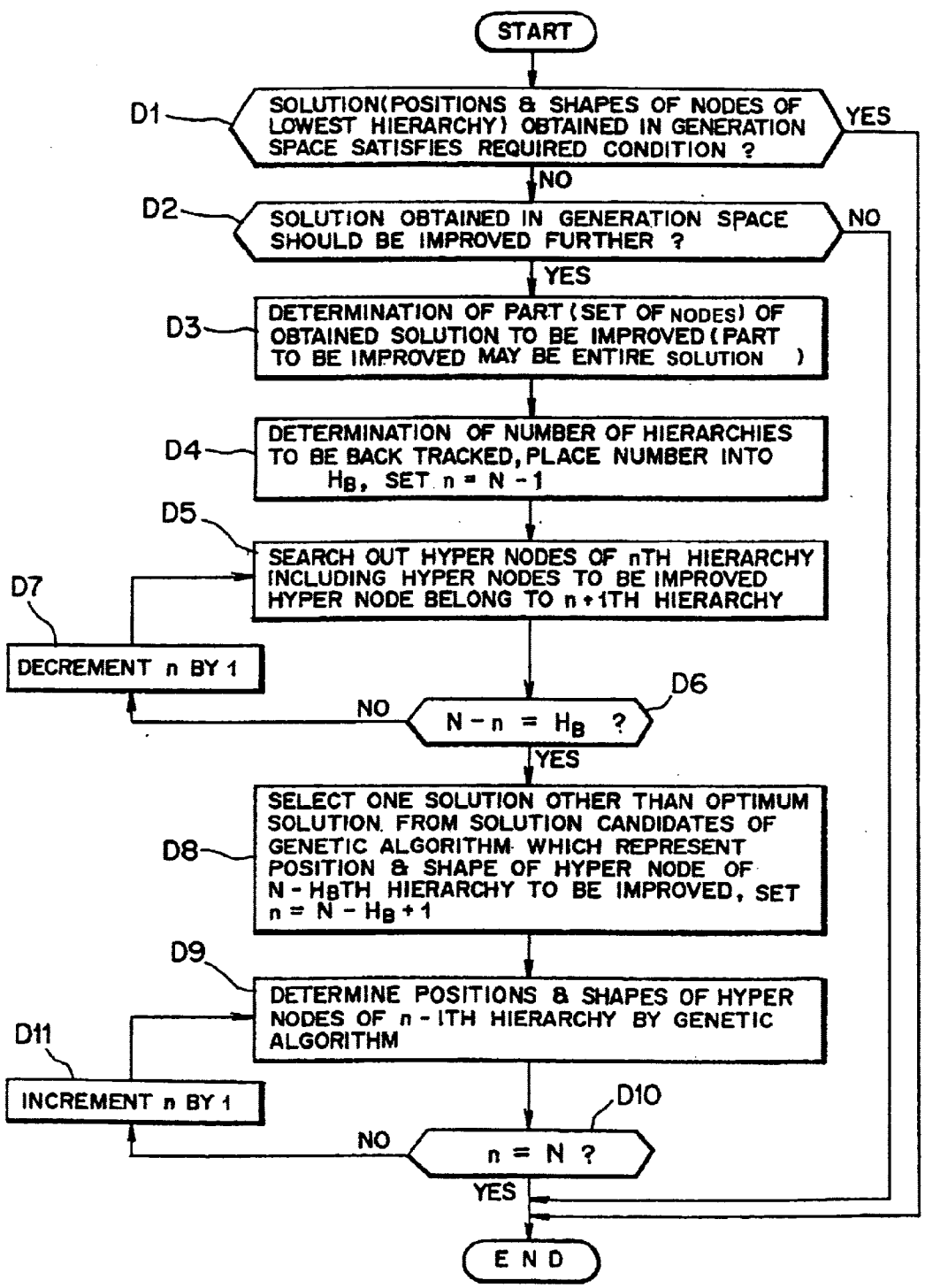

Then, the node optimum arrangement section 43 discriminates whether or not the optimum solution (positions and shapes of the nodes 100 to 102, 110, 111 and 120 to 122 of the lowest hierarchy) determined in the node optimum arrangement step described above satisfies an object condition (step A4 of FIG. 18/step D1 of FIG. 21). When the object condition is satisfied or, even if the object condition is not satisfied, the solution should not be improved, the search for an optimum solution is ended (the YES route in step A4 of FIG. 18/YES route in step D1 of FIG. 21, NO route in step D2 of FIG. 21).

Figure 6:
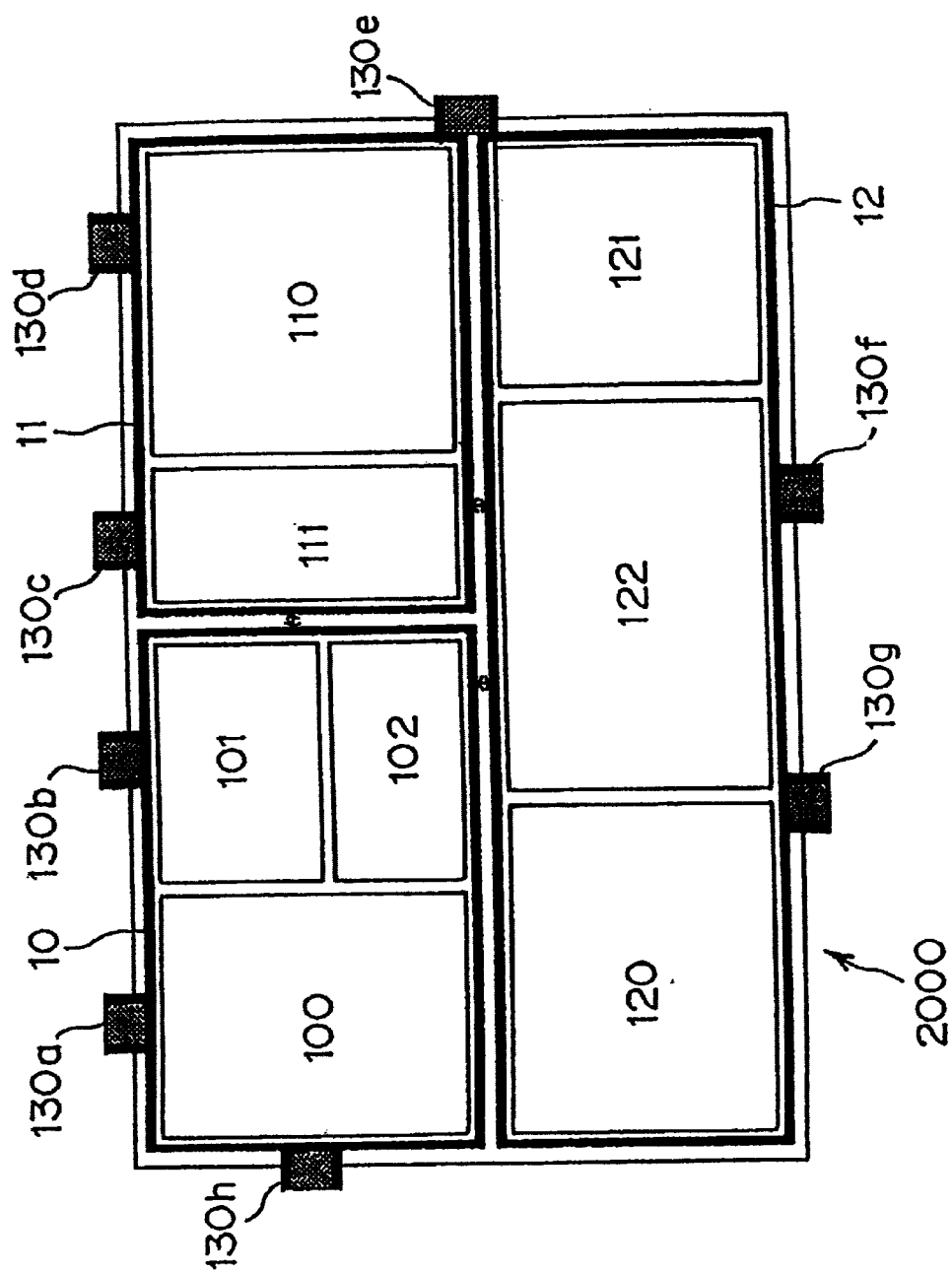
FIG. 6 is a schematic view showing an example of a result of arrangement of the plurality of hyper nodes/nodes of FIG. 4 in a generation space.

An example of a result of arrangement of the plurality of nodes 100 to 102, 110, 111 and 120 to 122 in the generation space is shown in FIG. 6.

Generally, the generation space is a two- or more-dimensional space, and each node may have an arbitrary shape in accordance with the dimensions of the generation space. In the present embodiment, however, for simplified description, the generation space 2000 has a rectangular shape as seen in FIG. 6, and the hyper nodes 10 to 12 and the nodes 100 to 102, 110, 111 and 120 to 122 have shapes defined to rectangles and arranged in the generation space 2000. It is to be noted that, also in FIG. 6, reference symbols 130a to 130h denote fixed nodes whose arrangement in the generation space is determined already.

A genetic algorithm mentioned above is described here. The genetic algorithm is a technique which simulates and technologically applies a mechanism of heredity of organisms and can be regarded as a method for probabilistic search, learning and optimization.

In a process of evolution of organisms, when a new individual (child) is born from existing individuals (parents), crossover between chromosomes of the individuals, mutation of genes on the chromosomes and so forth occur. Then, those individuals which do not fit the environment are weeded out, and those individuals which are higher in fitness to the environment survive and act as new parents to make new offsprings. Consequently, a population of individuals which fit the environment survives.

While it depends upon a chromosome (one-dimensional string of genes) to which degree each individual fits the environment, in a genetic algorithm, solution candidates to the arrangement optimization problem are represented as chromosomes each of which is a one-dimensional string of genes. Further, an object function of the arrangement optimization problem corresponds to the environment, and a fitness function which exhibits a higher value when it makes the object function nearer to an optimum one is defined for a chromosome.

Figure 14:
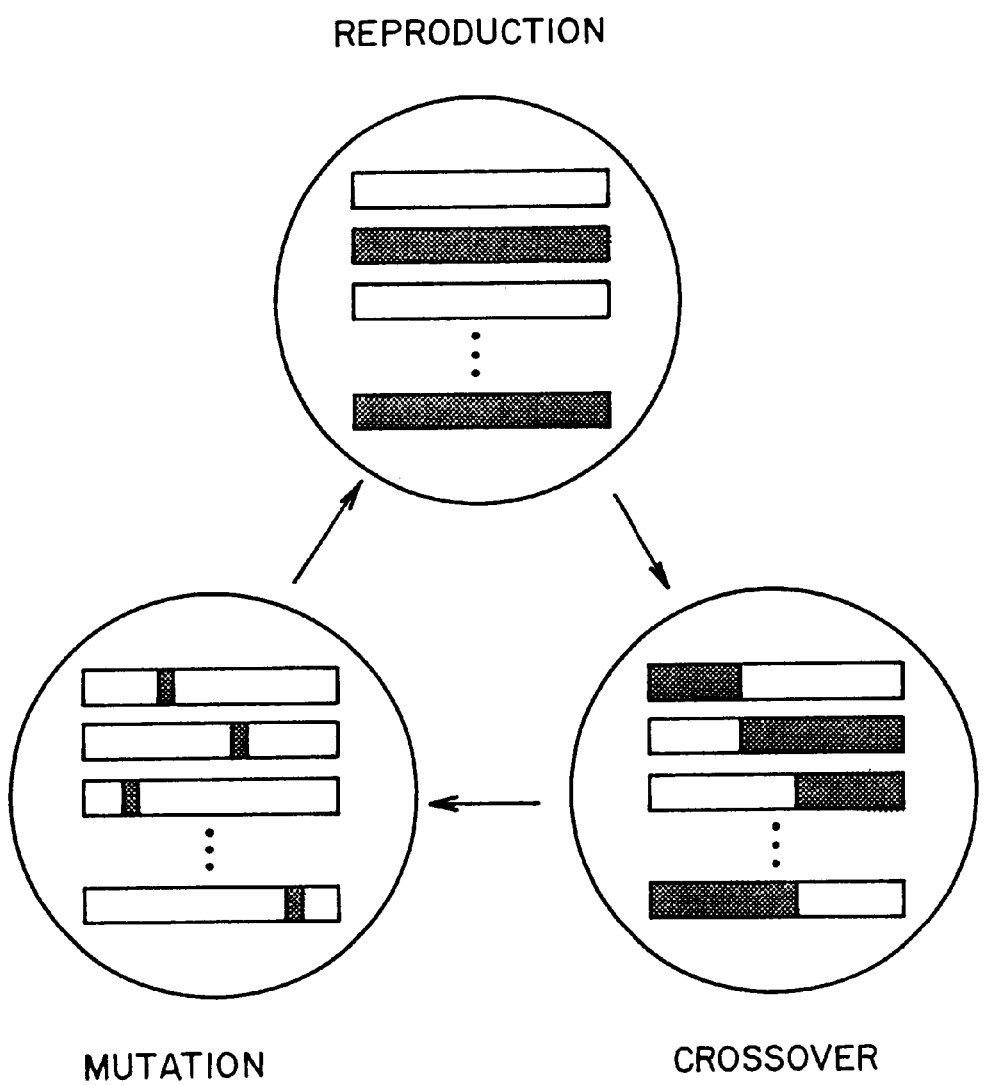
FIG. 14 is a diagrammatic view illustrating gene operations which may be performed for chromosomes.

Then, in the genetic algorithm, in order to vary the gene arrangement of a chromosome to produce a chromosome which may possibly be an optimum solution to the problem (that is, a solution which makes the object function nearer to an optimum one), such genetic operations (selection/self reproduction, crossover and mutation) as illustrated in FIG. 14 are performed for each chromosome.

Figure 15:
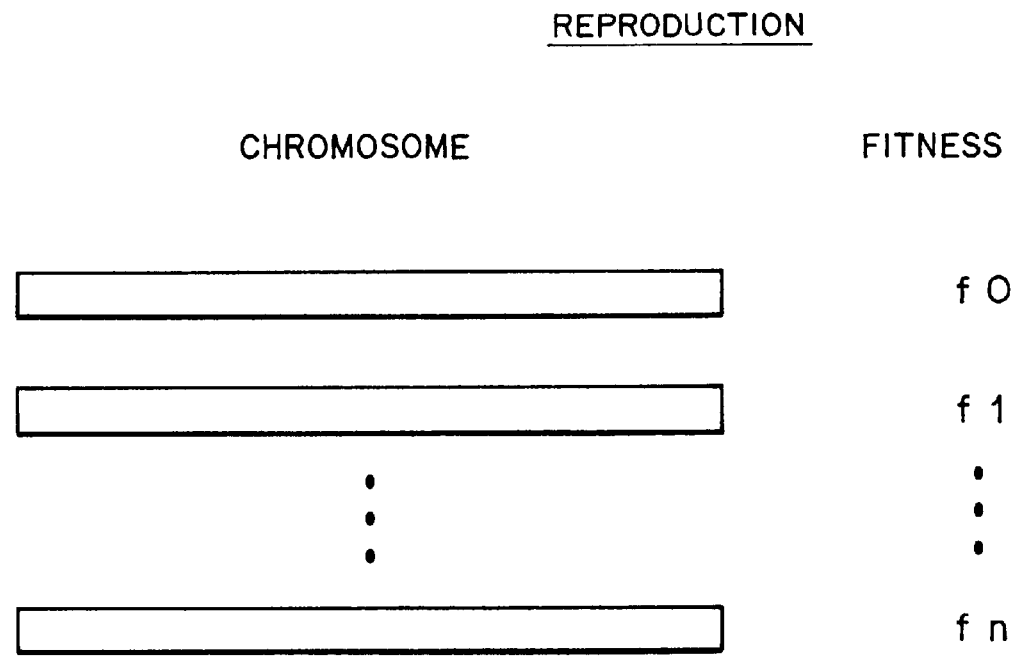
Figure 17:
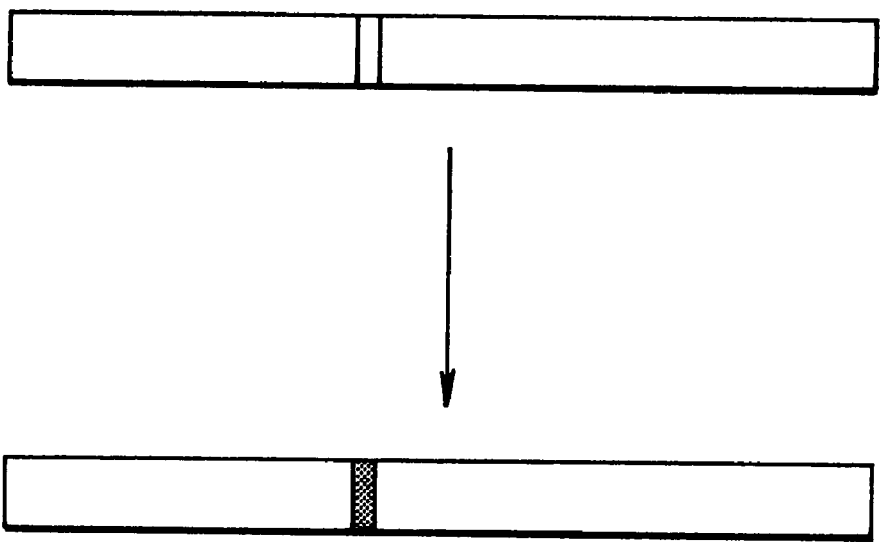

Here, selection/self reproduction is an operation to select an individual having a chromosome having a high fitness value in a population and employ the individual as a parent for the next generation (refer to FIG. 15). Crossover is an operation to exchange chromosomes of two parents partially for each other to produce a new individual (child) (refer to FIG. 16). Mutation is an operation to replace genes of a chromosome partially at random to vary the individual (refer to FIG. 17).

In the present embodiment, hyper nodes and nodes are represented as genes defined by the center coordinates of rectangles which are shapes of them and the aspect ratios of the rectangles by the hyper node arrangement section 42 and the node optimum arrangement section 43, respectively.

Then, the hyper node arrangement section 42 and the node optimum arrangement section 43 execute a genetic algorithm using chromosomes formed from all arrangements of genes as solution candidates to the problem of arrangement of the plurality of hyper nodes and nodes in the generation space, respectively.

An example of a construction of a chromosome to be used for determination of an arrangement of the hyper nodes 10 to 12 is shown in FIG. 8. Referring to FIG. 8, gene constructions of the hyper nodes 10 to 12 are shown successively from the left. In particular, the values of the leftmost gene [(x=0.24, y=0.74), (X=0.52, Y=0.53)] indicate that the center coordinates of the hyper node 10 are x=0.24, y=0.74, and the aspect ratio of the hyper node 10 is X:Y= 0.52:0.53. It is to be noted that this similarly applies also to the other values.

When a genetic algorithm is to be executed, the center coordinates of rectangles of genes which represent hyper nodes and nodes and the aspect ratios of the rectangles are determined so that the object function may exhibit a minimum value.

Then, in the present embodiment, for each chromosome, pasting crossover, mutation, selection and so forth are performed as genetic operations.

Here, the pasting crossover has, for example, the following five modes:

1) Pasting Crossover of the Center Coordinates of Rectangles and the Aspect Ratios of the Rectangles A suitable set of genes of a certain chromosome is selected, and the center coordinates of the rectangle defined by the selected genes and the aspect ratio of the rectangle are replaced with the center coordinates of a rectangle defined by genes of a same set of another chromosome and the aspect ratio of the rectangle, respectively.

In other words, the center coordinates of a rectangle defined by genes at a particular location which compose a certain chromosome and the aspect ratio of the rectangle are replaced with the center coordinates of a rectangle defined by genes at a same location which compose another chromosome and the aspect ratio of the rectangle, respectively.

2) Pasting Crossover Only of the Center Coordinates of a Rectangle

A set of suitable genes of a certain chromosome is selected, and the center coordinates of a rectangle defined by the selected genes are replaced with the center coordinates of another rectangle defined by genes of a same set of another chromosome.

In other words, the center coordinates of a rectangle defined by genes at a particular location which compose a certain chromosome are replaced by the center coordinates of another rectangle defined by genes at a same location which compose another chromosome.

3) Pasting Crossover Only of the Aspect Ratio of a Rectangle

A set of suitable genes of a certain chromosome is selected, and the aspect ratio of a rectangle defined by the selected genes is replaced with the aspect ratio of another rectangle defined by genes of a same set of another chromosome.

In other words, the aspect ratio of a rectangle defined by genes at a particular location which compose a certain chromosome is replaced by the aspect ratio of another rectangle defined by genes at a same location which compose another chromosome.

4) Pasting Crossover Based on Weighted Averages of the Center Coordinates of Rectangles A set of suitable genes of a certain chromosome is selected, and weighted averages of the center coordinates of a rectangle defined by the selected genes and the center coordinates of another rectangle defined by genes of a same set of another chromosome are calculated, and the thus calculated average values are replaced with the center coordinates of the another rectangle defined by the corresponding genes of the another chromosome. This can prevent an extremely large variation of a solution.

5) Pasting Crossover Based on a Weighted Average of the Aspect Ratios of Rectangles A set of suitable genes of a certain chromosome is selected, and a weighted average value of the aspect ratio of a rectangle defined by the selected genes and the aspect ratio of another rectangle defined by genes of a same set of another chromosome is calculated, and the thus calculated weighted value is replaced with the aspect ratio of the another rectangle defined by the corresponding genes of the another chromosome. Also this can prevent an extremely large variation of a solution.

Meanwhile, the mutation has, for example, such two modes as described below:

1) Mutation of the Aspect Ratio of a Rectangle

The aspect ratio of a rectangle defined by one gene (or a plurality of genes) which composes a chromosome is increased at a predetermined ratio (for example, only the length of the longitudinal sides of the rectangle is increased) to vary the same. Or, the aspect ratio of a rectangle defined by one gene (or a plurality of genes) which composes a chromosome is decreased at a predetermined ratio (for example, only the length of the longitudinal sides of the rectangle is decreased) to vary the same.

Or, the aspect ratio of a rectangle defined by one gene (or a plurality of genes) which composes a chromosome is increased or decreased at a predetermined ratio (for example, only the length of the longitudinal sides of the rectangle is increased) to vary the same. In this instance, whether the aspect ratio should be increased or decreased is determined stochastically.

2) Mutation of the Center Coordinates of a Rectangle

To the center coordinates of a rectangle defined by one gene (or a plurality of genes) which composes a chromosome, a positive or negative comparatively low value selected stochastically is added to vary the center coordinates of the rectangle.

Further, before selection is performed, fitness values of individual chromosomes are calculated. Such fitness values can be calculated, for example, by the following two methods. A suitable one of the two methods is preferentially used in accordance with the hierarchy.

Figure 13A:
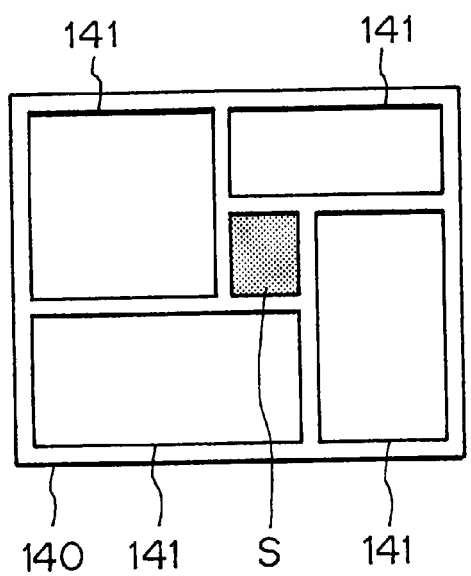
FIGS. 13(a) and 13(b) are diagrammatic views illustrating arrangements of hyper nodes or nodes.
Figure 13B:
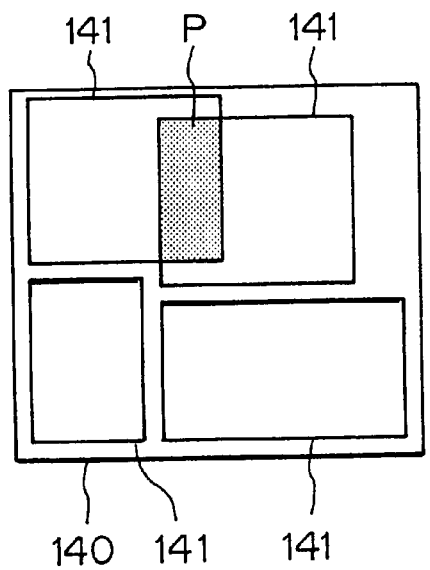

1) Method which takes a Sum Total of the Areas of Overlapping Portions of Hyper Nodes (or Nodes) into Consideration A fitness value of a chromosome is calculated taking a sum total of the lengths of wiring lines for interconnecting a plurality of hyper nodes (or nodes) arranged in a generation space and a sum total of the areas of overlapping portions of the hyper nodes (or nodes) into consideration. It is to be noted that a manner in which hyper nodes (or nodes) overlap with each other is shown in FIG. 13(b). Referring to FIG. 13(b), reference symbol 140 denotes a hyper node in a generation space or a higher hierarchy, 141 a hyper node or node arranged in the hyper node 140, and P an overlapping portion between such hyper nodes (or nodes).

The calculation of a fitness value may be performed using weighted calculation for either one of the sum total of the lengths of the wiring lines for interconnecting the plurality of hyper nodes (or nodes) and the sum total of the areas of the overlapping portions of the hyper nodes (or nodes). In this instance, a fitness function as defined by the following expression (1) is used:

$$\text{Fitness value} = (\text{constant}) - (\text{weighted sum of wiring line length sum total and overlapping portion area sum total}) \quad (1)$$

By the calculation, a solution which presents a short wiring line length or with which hyper nodes (or nodes) are not likely to overlap with each other can be obtained.

2) Method which Takes the Sum Total of the Areas of Gap Portions between Hyper Nodes (or Nodes) into Consideration A fitness value of a chromosome is calculated taking the sum total of the lengths of wiring lines for interconnecting a plurality of hyper nodes (or nodes) arranged in a generation space and the sum total of the areas of gap portions among the hyper nodes (or nodes) into consideration. It is to be noted that a manner in which a gap is produced among hyper nodes (or nodes) is shown in FIG. 13(a). Referring to FIG. 13(a), reference symbol 140 denotes a hyper node in the generation space or a higher hierarchy, 141 a hyper node or node arranged in the hyper node 140, and S a gap portion among such hyper nodes (or nodes).

The calculation of a fitness value may be performed using weighted calculation for either one of the sum total of the lengths of the wiring lines for interconnecting the plurality of hyper nodes (or nodes) and the sum total of the areas of the gap portions of the hyper nodes (or nodes). In this instance, a fitness function as defined by the following expression (2) is used:

Fitness value (constant)−(weighted sum of wiring line length sum total and gap portion area sum total) (2)

By the calculation, a solution which presents a short wiring line length or with which a gap is produced less likely when hyper nodes (or nodes) are arranged can be obtained.

By the way, if the optimum solution (positions and shapes of the nodes 100 to 102, 110, 111 and 120 to 122 in the lowest hierarchy) calculated in such a manner as described above does not satisfy the object condition and improvement to the solution is to be performed, then back tracking to another hierarchy is performed by the hyper node arrangement section 42 to search for an optimum solution again (from the NO route of step A4 of FIG. 18 to step A5/from the YES route of step D2 of FIG. 21 to steps D3 to D11).

In short, while, in the present embodiment, based on an optimum solution obtained for the ith hierarchy (i=0 to N−1) using a genetic algorithm, optimization for lower hierarchies is performed. However, there is the possibility that a good solution may be obtained finally if, based on a solution other than an optimum solution for the ith hierarchy, optimization of lower hierarchies is performed.

Therefore, if the solution obtained does not satisfy the object condition, the hyper node arrangement section 42 searches for an optimum solution based on a solution other than the optimum solution for the pertaining hierarchy in order to improve the obtained solution. In this manner, also optimization across hierarchies is effective.

In particular, the hyper node arrangement section 42 arranges the plurality of hyper nodes 10 to 12 in the generation space 2000 based on one of the solutions obtained other than the optimum solution.

It is to be noted that, if an optimum value searched out by the tracking back to another hierarchy satisfies the object condition, then the processing of the node arrangement optimization problem of the arrangement optimization problem processing apparatus 1 is ended.

In this manner, with the processing method for the node arrangement optimization problem of the arrangement optimization problem processing apparatus 1 according to the embodiment of the present invention, by arranging hyper nodes formed by grouping of a plurality of nodes in a generation space and arranging the plurality of nodes in the generation space taking arrangement relationships of the hyper nodes into consideration, an optimum arrangement of the plurality of nodes can be determined also when the node arrangement optimization problem having a large problem scale is processed.

Here, if, when to arrange hyper nodes (or nodes) of a lower hierarchy in a plurality of hyper nodes of a higher hierarchy, a genetic algorithm is performed for each of the hyper nodes of the higher hierarchy, then calculation for the node arrangement optimization program can be performed by parallel processing, and consequently, an optimum solution to the arrangement optimization problem can be found out at a higher speed.

Then, by such a global search method of a genetic algorithm as described above, an optimum solution to an arrangement optimization problem can be searched out efficiently.

Further, by estimating and determining a connection relationship and a coupling strength between hyper nodes from connection relationships and coupling strengths between hyper nodes of a lower hierarchy, the time required for determination of the connection relationship and the coupling strength between the hyper nodes can be decreased.

On the other hand, if the positions and the shapes of nodes of the lowest hierarchy do not satisfy the object condition, then a more optimum solution can be searched out by performing back tracking to another hierarchy to search for an optimum solution again. Particularly in a genetic algorithm, since it includes a plurality of solution candidates for each hierarchy, when back tracking to another hierarchy is to be performed, any other solution than the solution (optimum solution) which has been used formerly can be adopted immediately, and back tracking to another hierarchy can be performed at a high speed.

Furthermore, since pasting crossover suitable for the arrangement optimization problem is performed as a genetic operation for each chromosome, the quality of chromosomes produced as solution candidates to the arrangement optimization problem can be augmented, and as a result, an optimum solution can be searched out efficiently.

Further, where the crossover is based on weighted averages of the center coordinates of rectangles defined by genes which form chromosomes and/or the aspect ratios of the rectangles, the solution can be prevented from being varied extremely, and this contributes to an increase in fitness.

Furthermore, where calculation of a fitness value is performed by performing weighted calculation for either one of the sum total of the lengths of wiring lines for interconnecting hyper nodes and the sum total of the areas of overlapping portions of the hyper nodes, a solution conforming to an object [a solution with which the wiring line length is short or with which hyper nodes (or nodes) do not overlap each other] can be obtained.

Alternatively, where calculation of a fitness value is performed by performing weighted calculation for either one of the sum total of the lengths of wiring lines for interconnecting hyper nodes and the sum total of the areas of gap portions among the hyper nodes, a solution conforming to an object [a solution with which the wiring line length is short or with which, when hyper nodes (or nodes) are arranged, a gap portion is less likely to be produced] can be obtained.

c. Concrete Examples of the Arrangement Optimization Problem

As concrete examples of the arrangement optimization problem described above, (1) an LSI arrangement problem (floor plan) and (2) another LSI arrangement problem (hierarchical arrangement method) are described in outline.

(1) LSI Arrangement Problem (Floor Plan)

As a kind of arrangement problem of an LSI, there is a floor plan. The floor plan is a problem that, although the areas of cells to be arranged are determined, the lengths of sides of the cells are variable.

For processing of the floor plan, the arrangement optimization problem processing apparatus 1 and the processing method described above can be used.

In particular, the floor plan can be replaced with a problem to arrange a plurality of rectangles having fixed areas and having variable aspect ratios in a predetermined region. In this instance, the object function is a sum of the sum total of the lengths of wiring lines for interconnecting the plurality of rectangles and and the sum total of the areas of overlapping portions of the plurality of rectangles. Then, a fitness value is calculated based on the object function.

(2) LSI Arrangement Problem (Hierarchical Arrangement Method)

Among arrangement problems of an LSI, it is an important problem to arrange, where connection relationships between cells and connection relationships between fixed cells (called pads) and non-fixed cells are given, the non-fixed cells in a predetermined arrangement region so that the wiring line length may be minimized.

One of such problems resides in a case wherein cells are grouped into hyper cells in advance and this is given as hierarchical logic information (for example, a filter element, an amplifier or the like is formed from a set of cells).

Figure 9:
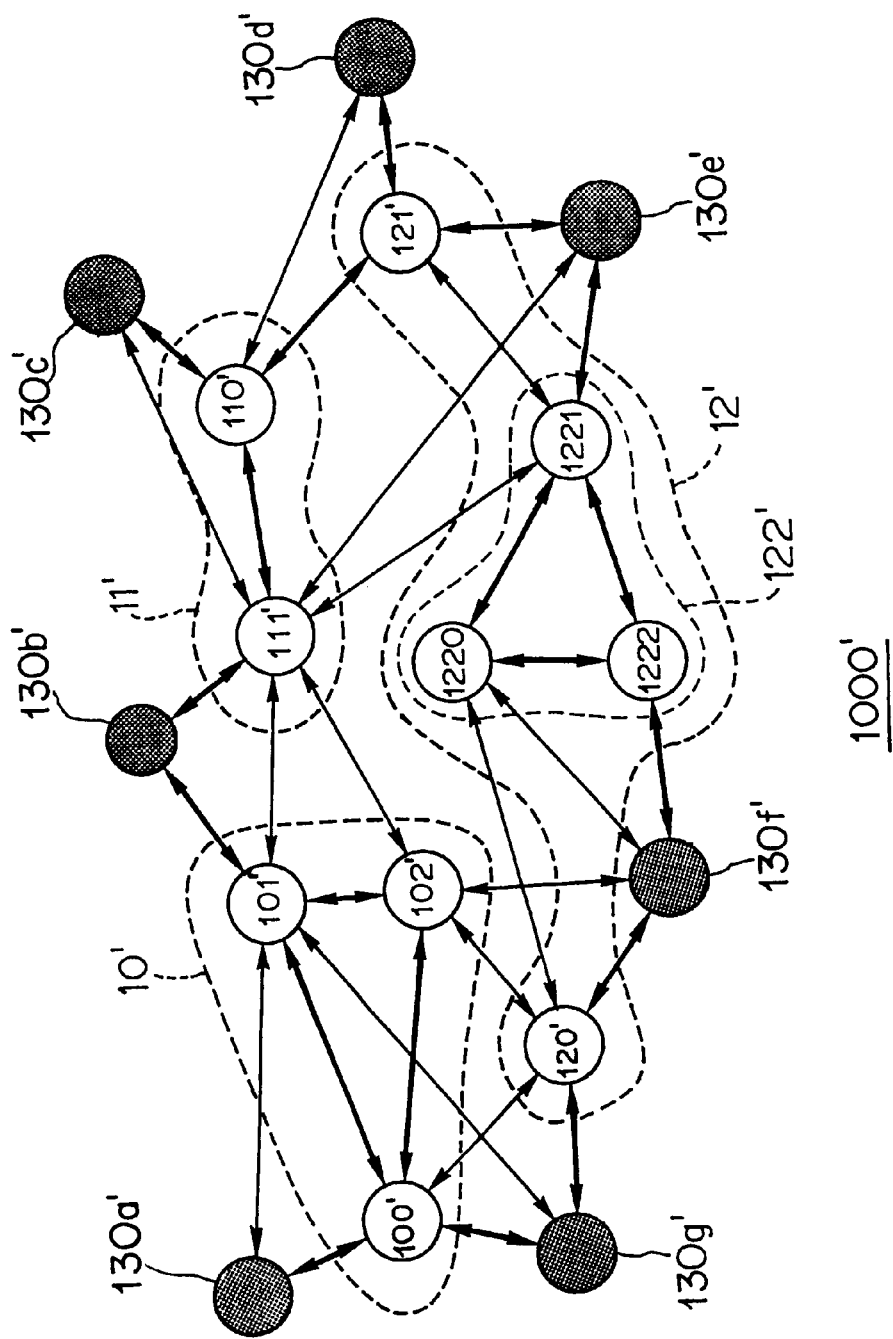
FIG. 9 is a diagrammatic view showing connection relationships of a plurality of cells.
Figure 10:
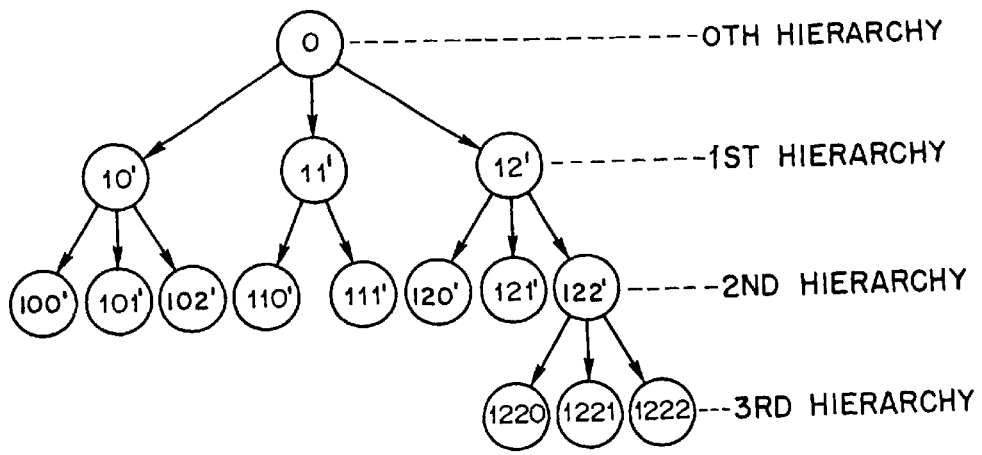
FIG. 10 is a diagrammatic view illustrating hierarchized cells.

In particular, an exemplary case is shown, for example, in FIG. 9 wherein cells 100' to 102' are grouped into a hyper node 10', cells 110' and 111' are grouped into another hyper node 11', and cells 120' to 122' are grouped into a further hyper node 12' in advance. It is to be noted that the cell 122' is formed from cells 1220 to 1222. Further, in FIG. 9, reference symbols 130*a*' to 130*g*' denote fixed cells whose arrangement on an LSI is determined already, and the coupling strength between each two cells is indicated by the thickness of a double-sided arrow mark between the cells shown in FIG. 9. Furthermore, reference symbol 1000' denotes a system space. Hierarchies of the cells shown in FIG. 9 are shown in FIG. 10.

In this instance, since the hyper cells correspond to hyper nodes described above, the arrangement optimization problem processing apparatus 1 and the processing method described above can be applied. For convenience, it is determined that the highest hierarchy is the entire LSI, and the lowest hierarchy is all of the cells.

(i) Fitness Value

The object function is a sum of the sum total of the lengths of wiring lines for interconnecting the hyper cells in each hierarchy and the sum total of the areas of overlapping portions of the hyper cells.

Accordingly, the fitness value can be calculated in accordance with $$\text{Fitness value} = (\text{constant}) - (\text{object function}) \quad (3)$$

(ii) Arrangement Method

Where given LSI arrangement data are hierarchical logic information, since the cells are hierarchized already to form hyper cells, a hierarchical arrangement method can be applied.

Figure 12:
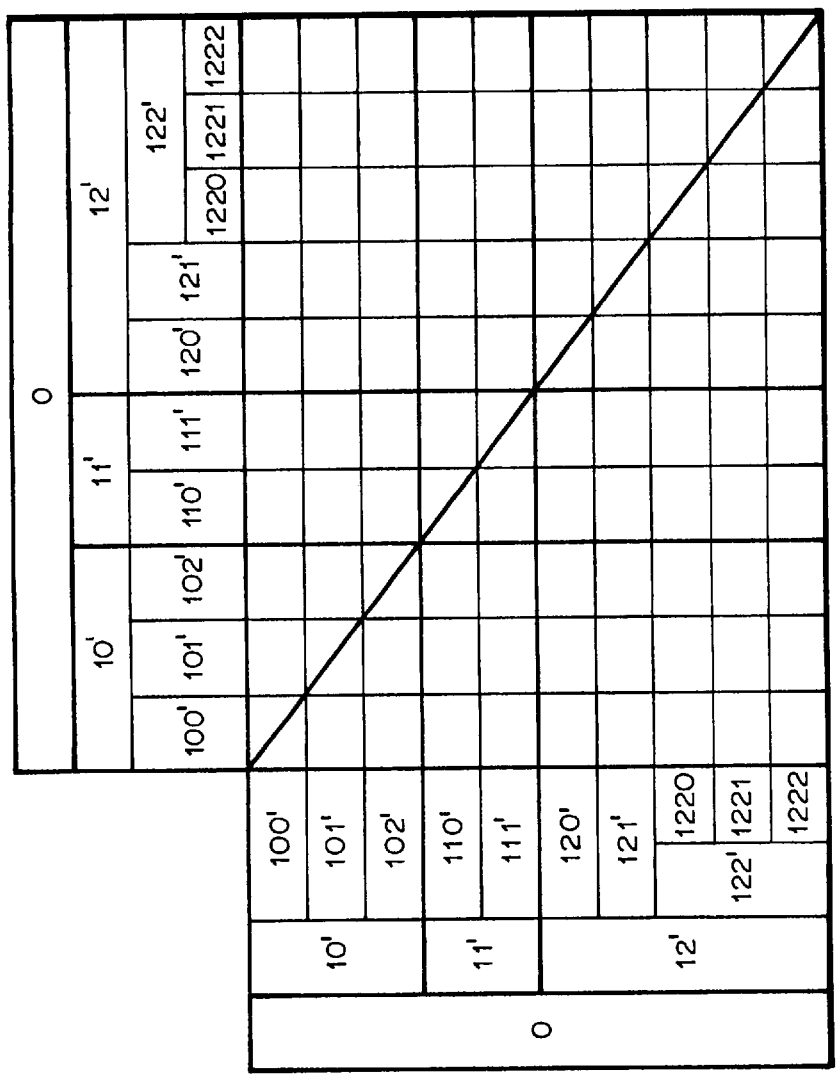
FIG. 12 is a diagram illustrating another example of a coupling strength table.

Then, since the coupling strength between each two hyper cells of the ith hierarchy can be determined from the coupling strengths between hyper cells of the lower i+1th hierarchy, the calculation time can be reduced significantly. A cell coupling strength table which is used for the determination is shown in FIG. 12.

The arrangement of the hyper cells of the ith hierarchy on the LSI is determined by a genetic algorithm. Further, the arrangement of the hyper cells on the i+1th hierarchy is determined by the genetic algorithm after an initial arrangement of the hyper cells of the i+1th hierarchy by referring to a result of the arrangement of the ith hierarchy.

Then, a final arrangement of the cells on the LSI can be determined by performing the procedure described above from the highest hierarchy to the lowest hierarchy.

Figure 11:
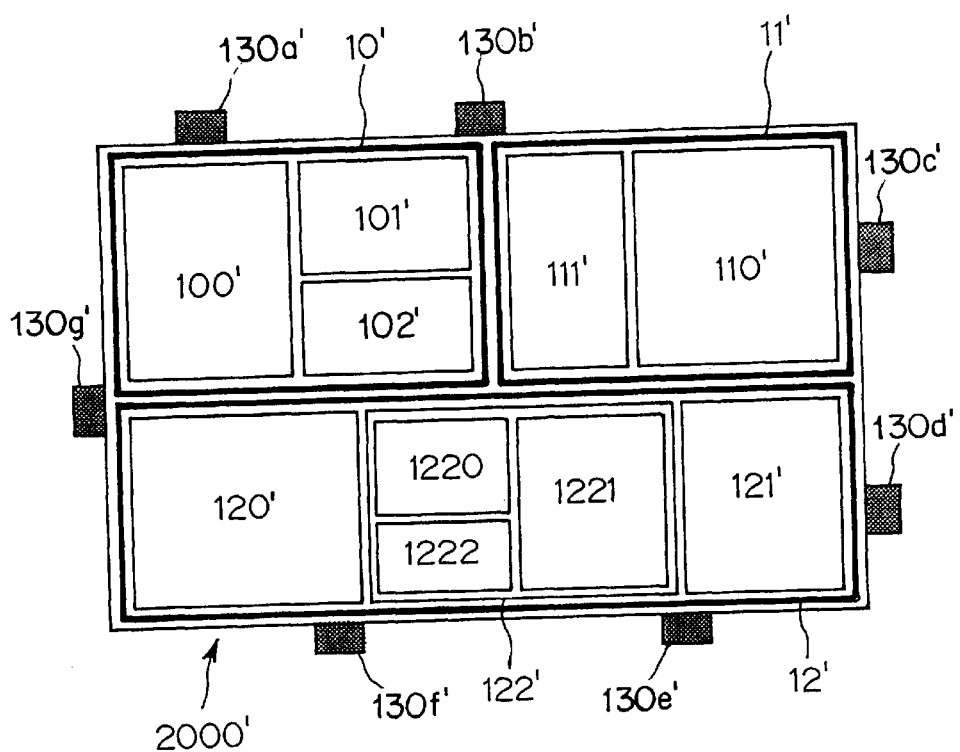
FIG. 11 is a schematic view showing an example of a result of arrangement of the plurality of cells of FIG. 9 on an LSI.

A result of the hierarchical arrangement of the cells on the LSI is illustrated in FIG. 11. Referring to FIG. 11, reference symbol 2000' denotes a region on the LSI.

In this manner, an increase in fitness can be accelerated by a combination of a genetic algorithm and a hierarchical arrangement method.

d. Others

It is to be noted that, while, in the foregoing description, it is described that the nodes and the hyper nodes have rectangular shapes, the nodes and the hyper nodes may have simply-connected arbitrary shapes (for example, circular, elliptical or polygonal shapes or sum-sets of rectangles or the like) in accordance with an arrangement optimization problem which makes an object of processing.

Particularly in a case wherein shapes of nodes and hyper nodes are graphic forms which can be represented as sum-sets of rectangles, since the argument given above can be expanded, the arrangement optimization problem processing apparatus 1 and the processing method described above can be applied suitably.

Further, the shapes of nodes and hyper nodes may be three-dimensional shapes.

Further, while, in the foregoing description, the hyper node arrangement section 42 and the node optimum arrangement section 43 execute a genetic algorithm as an optimization problem solution algorithm, they may alternatively execute some other optimization problem solution algorithm such as, for example, a min-cut method, an n-element exchanging method, a self organization method or the like. Further, the hyper node arrangement section 42 and the node optimum arrangement section 43 may execute different optimization problem solution algorithms from each other.

It is to be noted that the arrangement optimization problem processing apparatus 1 and the processing method described above can be expanded also to a case wherein the values assumed by genes of a chromosome are continuous values.

By the way, while the arrangement optimization problem processing apparatus 1 and the processing method described above arrange a plurality of nodes, whose connection relationships are indicated in a system space, in a generation space, more generally they can be applied also to a case wherein a plurality of elements are to be arranged.

In particular, according to the present invention, an arrangement optimization problem processing method for arranging a plurality of elements in a two- or more-dimensional space may comprise a hyper element formation step of grouping the plurality of elements to form a plurality of hyper elements each formed from a set of elements, a hyper element arrangement step of executing an optimization problem solution algorithm to determine solutions to a problem of arrangement of the plurality of hyper elements formed by the hyper element formation step in the generation space and arranging the plurality of hyper elements in the generation space based on one of the determined solutions, and an element optimum arrangement step of executing another optimization problem solution algorithm taking arrangement relationships of the plurality of hyper elements obtained by the hyper element arrangement step into consideration to determine a solution to a problem of arrangement of the plurality of elements in an optimum condition in the generation space and arranging the plurality of elements in the generation space based on the determined solution.

The present invention is not limited to the specifically described embodiment, and variations and modifications may be made without departing from the scope of the present invention.

What is claimed is:

1. A layout operation for arranging a layout of a plurality of nodes in a generation space of a computer system, comprising:

a definition operation of defining each node as a geographical shape set by associated coordinates, wherein each node has a connection relationship to other nodes of the plurality of nodes;

a hyper node formation operation of forming a plurality of hyper nodes from sets of the nodes;

a hyper node arrangement operation of executing an optimization problem solution algorithm to determine a plurality of solutions to a problem of arrangement of the plurality of hyper nodes formed by the hyper node formation step in the generation space and arranging the plurality of hyper nodes in the generation space based on one of the determined solutions;

a node optimum arrangement operation, carried out after the hyper node arrangement step, of executing the optimization problem solution algorithm taking arrangement relationships between the plurality of hyper nodes obtained by the hyper node arrangement step into consideration to determine a solution to a problem of arrangement of the plurality of nodes in an optimum condition in the generation space and arranging the plurality of nodes in the generation space based on the determined solution; and an arrangement output operation of laying out the determined arrangement of the plurality of nodes as an arrangement of a plurality of geographical shapes, based upon the arrangement relationships between the plurality of the hyper nodes.

2. The layout operation as claimed in claim 1, wherein the hyper node arrangement operation arranges the plurality of hyper nodes in the generation space taking a constraint in arrangement of the hyper nodes into consideration.

3. The layout operation as claimed in claim 2, wherein each of the hyper nodes includes a plurality of sub hyper nodes each formed from a partial set of a plurality of nodes which form the hyper node, and further comprising a constraint search operation of determining the constraint to the hyper node based on the constraint to the sub hyper nodes.

4. The layout operation as claimed in claim 1, wherein the hyper node arrangement operation executes a genetic algorithm as the optimization problem solution algorithm to determine solutions to the problem of arrangement of the plurality of hyper nodes formed by the hyper node formation step in the generation space and arranges the plurality of hyper nodes in the generation space based on one of the determined solutions.

5. The layout operation as claimed in claim 4, wherein the hyper node arrangement operation arranges the plurality of hyper nodes in the generation space based on an optimum one of the determined solutions.

6. The layout operation as claimed in claim 4, wherein the hyper node arrangement operation arranges the plurality of hyper nodes in the generation space based on one of the determined solutions other than an optimum solution.

7. The layout operation as claimed in claim 4, wherein, where the generation space has a rectangular shape, when the hyper node arrangement operation and the node optimum arrangement operation define shapes of the hyper nodes and the nodes to rectangles and arrange the hyper nodes and the nodes in the generation space, respectively, the hyper node arrangement operation and the node optimum arrangement operation represent the hyper nodes and the nodes as genes composed of information regarding center coordinates of the rectangles and information regarding aspect ratios of the rectangles and execute the genetic algorithm using chromosomes composed of arrangements of the genes as solution candidates to the problem of arrangement of the plurality of hyper nodes and the plurality of nodes in the generation space, respectively.

8. The layout operation as claimed in claim 7, wherein, when the genetic algorithm is executed, pasting crossover wherein information regarding the center coordinates of the rectangle of one of the genes which comprise one of the chromosomes and information regarding the aspect ratio of the rectangle are replaced with the center coordinate information and the aspect ratio information, respectively, of a corresponding one of the genes which comprise another one of the chromosomes is performed as a genetic operation for the chromosomes.

9. The layout operation as claimed in claim 7, wherein, when the genetic algorithm is executed, pasting crossover wherein information regarding the center coordinates of the rectangle of one of the genes which comprise one of the chromosomes is replaced with the center coordinate information of a corresponding one of the genes which comprise another one of the chromosomes is performed as a genetic operation for the chromosomes.

10. The layout operation as claimed in claim 9, wherein the pasting crossover is based on a weighted average of the information regarding the center coordinates of the rectangles.

11. The layout operation as claimed in claim 7, wherein, when the genetic algorithm is executed, pasting crossover wherein information regarding the aspect ratio of the rectangle of one of the genes which comprise one of the chromosomes is replaced with the aspect ratio information of a corresponding one of the genes which comprise another one of the chromosomes is performed as a genetic operation for the chromosomes.

12. The layout operation as claimed in claim 11, wherein the pasting crossover is based on a weighted average of the information regarding the aspect ratios of the rectangles.

13. The layout operation as claimed in claim 7, wherein, when the genetic algorithm is executed, mutation wherein the information regarding the aspect ratio of the rectangle of the gene which composes the chromosome is varied is performed as a genetic operation for the chromosome.

14. The layout operation as claimed in claim 13, wherein the mutation increases or decreases the information regarding the aspect ratio of the rectangle at a fixed ratio.

15. The layout operation as claimed in claim 14, wherein it is stochastically determined whether the information regarding the aspect ratio of the rectangle should be increased or decreased in the fixed ratio by the mutation.

16. The layout operation as claimed in claim 7, wherein, when the genetic algorithm is executed, mutation wherein the information regarding the center coordinates of the rectangle of the gene which comprises the chromosome is varied is performed as a genetic operation for the chromosome.

17. The layout operation as claimed in claim 16, wherein the mutation adds a stochastically selected value to the information regarding the center coordinates of the rectangle to vary the information regarding the center coordinates of the rectangle.

18. The layout operation as claimed in claim 7, wherein, when the genetic algorithm is executed, before selection as a genetic operation is performed for the chromosome, a fitness value of the chromosome is calculated taking a sum total of lengths of wiring lines for interconnecting the plurality of hyper nodes arranged in the generation space into consideration.

19. The layout operation as claimed in claim 7, wherein, when the genetic algorithm is executed, before selection as a genetic operation is performed for the chromosome, a fitness value of the chromosome is calculated taking a sum total of areas of overlapping portions of the plurality of hyper nodes arranged in the generation space into consideration.

20. The layout operation as claimed in claim 7, wherein, when the genetic algorithm is executed, before selection as a genetic operation is performed for the chromosome, a fitness value of the chromosome is calculated taking a sum total of lengths of wiring lines for interconnecting the plurality of hyper nodes arranged in the generation space and a sum total of areas of overlapping portions of the plurality of hyper nodes into consideration.

21. The layout operation as claimed in claim 20, wherein the calculation of the fitness value is performed by performing weighted calculation for either one of a sum total of lengths of wiring lines for interconnecting the plurality of hyper nodes and a sum total of areas of overlapping portions of the plurality of hyper nodes.

22. The layout operation as claimed in claim 7, wherein, when the genetic algorithm is executed, before selection as a genetic operation is performed for the chromosome, a fitness value of the chromosome is calculated taking a sum total of areas-of gap portions among the plurality of hyper nodes arranged in the generation space into consideration.

23. The layout operation as claimed in claim 7, wherein, when the genetic algorithm is executed, before selection as a genetic operation is performed for the chromosome, a fitness value of the chromosome is calculated taking a sum total of lengths of wiring lines for interconnecting the plurality of hyper nodes arranged in the generation space and a sum total of areas of gap portions among the plurality of hyper nodes into consideration.

24. The layout operation as claimed in claim 23, wherein the calculation of the fitness value is performed by performing weighted calculation for either one of a sum total of lengths of wiring lines for interconnecting the plurality of hyper nodes and a sum total of areas of gap portions among the plurality of hyper nodes.

25. The layout operation as claimed in claim 1, wherein the hyper node arrangement operation arranges the plurality of hyper nodes in the generation space based on an optimum one of the determined solutions.

26. The layout operation as claimed in claim 1, wherein the hyper node arrangement operation arranges the plurality of hyper nodes in the generation space based on one of the determined solutions other than an optimum solution.

27. The layout operation as claimed in claim 1, wherein, where the generation space is a two-dimensional space, the hyper node arrangement operation and the node optimum arrangement operation define shapes of the hyper nodes and the nodes as two-dimensional shapes and arrange the hyper nodes and the nodes in the generation space, respectively.

28. A layout operation for arranging a plurality of elements in a two- or more-dimensional space in a generation space of a computer system, comprising:

a definition operation of defining a plurality of elements for connection in an LSI (Large Scale Integrated Circuit) floorplan;

a hyper element formation operation of grouping the plurality of elements to form a plurality of hyper elements each formed from a set of the elements;

a hyper element arrangement operation of executing an optimization problem solution algorithm to determine solutions to a problem of arrangement of the plurality of hyper elements formed by the hyper element formation operation in the generation space and arranging the plurality of hyper elements in the generation space based on one of the determined solutions; and an element optimum arrangement operation, carried out after the hyper node arrangement step, of executing another optimization problem solution algorithm taking arrangement relationships between the plurality of hyper elements obtained by the hyper element arrangement operation into consideration to determine a solution to a problem of arrangement of the plurality of elements in an optimum condition in the generation space and arranging the plurality of elements in the generation space based on the determined solution; and an arrangement output operation of laying out a determined arrangement of the plurality of nodes in as an arranged plurality of elements, based upon the arrangement relationships between the plurality of the hyper elements.

29. A layout apparatus for arranging a layout of a plurality of nodes in a generation space of a computer system, comprising:

means for defining each of a plurality of nodes as a geographical shape set by associated coordinates, wherein each node has a connection relationship to other nodes of the plurality of nodes;

hyper node formation means for grouping the plurality of nodes to form a plurality of hyper nodes each formed from a set of the nodes;

hyper node arrangement means for executing an optimization problem solution algorithm to determine solutions to a problem of arrangement of the plurality of hyper nodes formed by said hyper node formation means in the generation space and arranging the plurality of hyper nodes in the generation space based on one of the determined solutions; and node optimum arrangement means for executing the optimization problem solution algorithm, after arranging the plurality of hyper nodes, taking arrangement relationships between the plurality of hyper nodes obtained by said hyper node arrangement means into consideration to determine a solution to a problem of arrangement of the plurality of nodes in an optimum condition in the generation space and arranging the plurality of nodes in the generation space based on the determined solution; and an arrangement output means for laying out the determined arrangement of the plurality of nodes as an arrangement of a plurality of geographical shapes, based upon the arrangement relationships between the plurality of the hyper nodes.

30. A computer-readable recording medium storing a layout program for causing a computer to layout a plurality of nodes in a generation space of a computer system, the program comprising:

a definition operation of defining each of a plurality of nodes as a geographical shape set by associated coordinates, wherein each node has a connection relationship to other nodes of the plurality of nodes;

a hyper node formation operation of grouping the plurality of nodes to form a plurality of hyper nodes each formed from a set of the nodes;

a hyper node arrangement operation of executing an optimization problem solution algorithm to determine solutions to a problem of arrangement of the plurality of hyper nodes formed by said hyper node formation operation in the generation space and arranging the plurality of hyper nodes in the generation space based on one of the determined solutions;

a node optimum arrangement operation, carried out after the hyper node arrangement operation, of executing the optimization problem solution algorithm taking arrangement relationships between the plurality of hyper nodes obtained by said hyper node arrangement operation into consideration to determine a solution to a problem of arrangement of the plurality of nodes in an optimum condition in the generation space and arranging the plurality of nodes in the generation space based on the determined solution; and an arrangement output operation of laying out the determined arrangement of the plurality of nodes as an arrangement of a plurality of geographical shapes, based upon the arrangement relationships between the plurality of the hyper nodes.

31. A layout method for arranging a layout of a multiplicity of nodes, whose interconnection relationship is previously determined, in a predetermined space, comprising:

(a) defining the multiplicity of nodes as a multiplicity of geographical shapes so that each of the multiplicity of nodes is associated with a respective one of the multiplicity of geographical shapes, and also defining a first optimization problem required to optimize a layout of the multiplicity of nodes in the predetermined space;

(b) grouping the multiplicity of the nodes to form a sub-multiplicity of hyper-nodes in a hierarchy of N+1 layers so that each of the hyper-nodes in any nth layer includes a plurality of hyper-nodes or nodes in any (n−l)th layer, where N is a natural number more than one, the 0th layer is the top layer, the Nth layer is the bottom layer including the multiplicity of nodes, and n is a natural number between one and N inclusive;

(c) determining an optimum solution to a second optimization problem, based upon arrangement relationships between the hyper-nodes, required to optimize a layout of the hyper-nodes in the 0th layer in the predetermined space, by executing an optimization-problem solution algorithm on the second optimization problem;

(d) repeatedly determining an optimum solution to a second optimization problem required to optimize a layout of the hyper-nodes in the mth layer in the predetermined space, where m is a natural number between one and N−1 inclusive, with increasing the value of m by one beginning from one until m becomes N−1, by executing an optimization-problem solution algorithm on the second optimization problem corresponding to the mth layer using the optimum solution to the second optimization problem corresponding to the (m−1)th layer;

(e) determining the optimum solution to the first optimization problem by executing the optimization problem solution algorithm on the first optimization problem, using the optimum solution to the second optimization problem corresponding to the (N−l)th layer; and (f) laying out the multiplicity of nodes in the predetermined space based on the determined optimum solution to the first optimization problem as the layout of the multiplicity of nodes.

32. A method for arranging a layout of a multiplicity of nodes, whose interconnection relationship is previously determined, in a predetermined space, comprising:

(a) defining the multiplicity of nodes as a multiplicity of geographical shapes so that each of the multiplicity of nodes is associated with a respective one of the multiplicity of geographical shapes, and also defining a first optimization problem required to optimize a layout of the multiplicity of nodes in the predetermined space;

(b) grouping the multiplicity of nodes to form a sub-multiplicity of hyper-nodes in a hierarchy of N+1 layers so that each of the hyper-nodes in any nth layer includes a plurality of hyper-nodes or nodes in any (n−1)th layer, where N is a natural number more than one, the 0th layer is the top layer, the Nth layer is the bottom layer including the multiplicity of nodes, and n is a natural number between one and N inclusive;

(c) determining an optimum solution to a second optimization problem, based upon arrangement relationships between the hyper-nodes, required to optimize a layout of the hyper-nodes in the 0th layer in the predetermined space, by executing an optimization-problem solution algorithm on the second optimization problem;

(d) repeatedly determining an optimum solution to a second optimization problem required to optimize a layout of the hyper-nodes in the mth layer in the predetermined space, where m is a natural number between one and N−1 inclusive, with increasing the value of m by one beginning from one until m becomes N−1, by executing an optimization-problem solution algorithm on the second optimization problem corresponding to the mth layer using the optimum solution to the second optimization problem corresponding to the (m−l)th layer;

(e) determining the optimum solution to the first optimization problem by executing the optimization problem solution algorithm on the first optimization problem, using the optimum solution to the second optimization problem corresponding to the (N−l)th layer; and (f) laying out the multiplicity of nodes in the predetermined space based on the determined optimum solution to the first optimization problem.

33. A layout method of determining an optimum solution to a first optimization problem required to optimize a layout of a multiplicity of nodes, whose interconnection relationship is previously determined, in a predetermined space so as to arrange a multiplicity of geographical shapes, each of which is associated with a respective one of the multiplicity of nodes, in the predetermined space based on the determined optimum solution to the first optimization problem, said method comprising the steps, carried out by a computer system, of:

(a) grouping the multiplicity of nodes to form a sub-multiplicity of hyper-nodes, each of said hyper-nodes including a plurality of nodes from the multiplicity of nodes;

(b) determining an optimum solution to a second optimization problem, based upon arrangement relationships between the hyper-nodes, required to optimize a layout of said hyper-nodes formed in said step (a) in the predetermined space, by executing an optimization-problem solution algorithm on the second optimization problem; and (c) determining the optimum solution to the first optimization problem by executing the optimization problem solution algorithm on the first optimization problem, using the optimum solution to the second optimization problem determined in said step (b).

34. A layout method of determining an optimum solution to a first optimization problem required to optimize a layout of a multiplicity of elements in a two or more dimensional predetermined space to arrange the multiplicity of elements in the predetermined space based on the determined optimum solution to the first optimization problem, said method comprising the steps, carried out by a computer system, of:

(a) grouping the multiplicity of elements to form a sub-multiplicity of hyper-elements, each of said hyper-elements including a plurality of elements from the multiplicity of elements;

(b) determining an optimum solution to a second optimization problem, based upon arrangement relationships between the hyper-elements, required to optimize a layout of said hyper-elements formed in said step (a) in the predetermined space, by executing an optimization problem solution algorithm on the second optimization problem; and (c) determining the optimum solution to the first optimization problem by executing the optimization problem solution algorithm on the first optimization problem, using the optimum solution to the second optimization problem determined in said step (b).

35. A computer-readable medium storing a layout program for determining an optimum solution to a first optimization problem required to optimize a layout of a multiplicity of elements in a two or more dimensional predetermined space to arrange the multiplicity of elements in the predetermined space based on the determined optimum solution to the first optimization problem, wherein said program instructs a computer to carry out the following functions of:

(a) grouping the multiplicity of elements to form a submultiplicity of hyper-elements, each of said hyper-elements including a plurality of elements from the multiplicity of elements;

(b) determining an optimum solution to a second optimization problem, based upon arrangement relationships between the hyper-elements, required to optimize a layout of said hyper-elements formed in said function (a) in the predetermined space, by executing an optimization problem solution algorithm on the second optimization problem; and (c) determining the optimum solution to the first optimization problem by executing the optimization problem solution algorithm on the first optimization problem, using the optimum solution to the second optimization problem determined in said function (b).

36. A layout method of determining an optimum solution to a first optimization problem required to optimize a layout of a multiplicity of nodes, whose connection relationships are predetermined, in a predetermined space to arrange a multiplicity of geographical shape sets, each of which is associated with a respective one of the multiplicity of nodes, in the predetermined space based on the determined optimum solution to the first optimization problem, said method comprising the steps, carried out by a computer system, of:

(a) grouping the multiplicity of nodes to form a submultiplicity of hyper-nodes in a hierarchy of N+1 layers so that each of the hyper-nodes in any nth layer includes a plurality of hyper-nodes or nodes in any (n−1)th layer, where N is a natural number more than one, the 0th layer is the top layer, the Nth layer is the bottom layer including the multiplicity of nodes, and n is a natural number between one and N inclusive;

(b) determining an optimum solution to a second optimization problem, based upon arrangement relationships between the hyper-nodes, required to optimize a layout of the hyper-elements in the 0th layer in the predetermined space, by executing an optimization-problem solution algorithm on the second optimization problem;

(c) repeatedly determining an optimum solution to a second optimization problem required to optimize a layout of the hyper-elements in the mth layer in the predetermined space, where m is a natural number between one and N−1 inclusive, with increasing the value of m by one beginning from one until m becomes N−1, by executing an optimization-problem solution algorithm on the second optimization problem corresponding to the mth layer using the optimum solution to the second optimization problem corresponding to the (m−1)th layer; and (d) determining the optimum solution to the first optimization problem by executing the optimization problem solution algorithm on the first optimization problem, using the optimum solution to the second optimization problem corresponding to the (N−1)th layer.

37. A computer-readable medium storing a layout program for determining an optimum solution to a first optimization problem required to optimize a layout of a multiplicity of elements in a two or more dimensional predetermined space so as to arrange the multiplicity of elements in the predetermined space based on the determined optimum solution to the first optimization problem, wherein said program instructs a computer to carry out the following functions of:

(a) grouping the multiplicity of nodes to form a submultiplicity of hyper-nodes in a hierarchy of N+1 layers so that each of the hyper-nodes in any nth layer includes a plurality of hyper-nodes or nodes in any (n−1)th layer, where N is a natural number more than one, the 0th layer is the top layer, the Nth layer is the bottom layer including the multiplicity of nodes, and n is a natural number between one and N inclusive;

(b) determining an optimum solution to a second optimization problem, based upon arrangement relationships between the hyper-nodes, required to optimize a layout of the hyper-elements in the 0th layer in the predetermined space, by executing an optimization-problem solution algorithm on the second optimization problem;

(c) repeatedly determining an optimum solution to a second optimization problem required to optimize a layout of the hyper-elements in the mth layer in the predetermined space, where m is a natural number between one and N−1 inclusive, with increasing the value of m by one beginning from one until m becomes N−1, by executing an optimization-problem solution algorithm on the second optimization problem corresponding to the mth layer using the optimum solution to the second optimization problem corresponding to the (m−1)th layer; and (d) determining the optimum solution to the first optimization problem by executing the optimization problem solution algorithm on the first optimization problem, using the optimum solution to the second optimization problem corresponding to the (N−1)th layer.

38. A method of arranging a plurality of nodes in a generation space of a computer system, comprising:

forming a plurality of hyper nodes from the nodes; and executing an optimization problem solution algorithm to determine a plurality of solutions to a problem of arrangement of the plurality of hyper nodes, based upon arrangement relationships between the hyper-nodes.

39. The method as claimed in claim 38, wherein the forming of the hyper nodes comprises forming hyper nodes of different hierarchies, wherein a connection relationship between the hyper nodes of a higher hierarchy is determined by a connection relationship of the hyper nodes of a lower hierarchy.

40. The method as claimed in claim 38, wherein the forming of the hyper nodes comprises forming hyper nodes of different hierarchies, wherein a coupling strength between the hyper nodes of a higher hierarchy is determined by a coupling strength of the hyper nodes of a lower hierarchy.

* * * * *